United States Patent [19]
Kim

[11] Patent Number: 6,127,704
[45] Date of Patent: Oct. 3, 2000

[54] STRUCTURE OF SRAM CELL AND METHOD FOR FABRICATING THE SAME

[76] Inventor: Dong Sun Kim, 578-55, Myunmok 7-dong, Jungrang-ku, Seoul, Rep. of Korea

[21] Appl. No.: 09/042,713

[22] Filed: Mar. 17, 1998

[30] Foreign Application Priority Data

Oct. 28, 1997 [KR] Rep. of Korea ............... 97-55654

[51] Int. Cl.⁷ .................................................. H01L 29/72
[52] U.S. Cl. .......................... 257/365; 257/366; 257/371; 257/374; 257/393; 257/401; 438/153; 438/154; 438/157; 438/199; 438/266; 438/283
[58] Field of Search .............................. 257/365, 366, 257/371, 374, 393, 401; 438/153, 154, 157, 199, 266, 283

[56] References Cited

U.S. PATENT DOCUMENTS

| | | |
|---|---|---|
| 5,179,038 | 1/1993 | Kinney et al. ................. 437/78 |
| 5,332,688 | 7/1994 | Hashimoto et al. .............. 437/57 |
| 5,534,450 | 7/1996 | Kim ................................ 257/393 |

OTHER PUBLICATIONS

Akinori Sekiyama et al., A 1–V Operating 256–kb Full–CMOS SRAM, *IEEE Journal of Solid–State Circuits*, vol. 27, No. 5, May 1992, pp. 776–782.

*Primary Examiner*—Edward Wojciechowicz

[57] ABSTRACT

A CMOS SRAM cell includes a substrate divided by a well trench into an n well region and a p well region, first and second active regions each having a V shape, formed symmetrical relative to each other, and having the well trench in between, third and fourth active regions formed symmetrically relative to each other and offset from the second active region, first and second gate lines each crossing the first active region, the well trench, and the second active region, and a third gate line crossing the third and fourth active regions.

48 Claims, 29 Drawing Sheets

STRUCTURE OF SRAM CELL AND METHOD FOR FABRICATING THE SAME

This application claims the benefit of Korean Patent Application No. 55654/1997, filed Oct. 28, 1997, which is hereby incorporated by reference.

BACKGROUND OF THE INVENTION

1. Field of the Invention

The present invention relates to a semiconductor device, and more particularly, to a structure of a static random access memory (SRAM) cell operating at low power and low voltage and a method for fabricating the same.

2. Discussion of the Related Art

A general FULL-CMOS SRAM has disadvantages in that it includes two PMOS transistors and 4 NMOS transistors, and occupies a large area. Research and development has been directed to increasing packing density of a memory chip by minimizing an area occupied by an SRAM cell.

A structure of a SRAM cell will be discussed below.

FIG. 1 is a layout of a conventional CMOS SRAM cell. As shown in FIG. 1, a twin-well CMOS process using single-level polysilicon and double-level aluminum is implemented on an n-type substrate for a general SRAM chip. A gate in an NMOS device is 0.8 $\mu$m long, and a gate in a PMOS device is 1.2 $\mu$m long. A lightly doped drain (LDD) structure is used in an NMOS device to prevent hot carrier generation.

A gate oxide layer is 20 nm thick, and a threshold voltage of a PMOS device is −0.5V, while a threshold voltage of an NMOS device is 0.5V.

In the SRAM cell shown in FIG. 1, each first aluminum layer 11 is 1.3 $\mu$m wide and a distance between each of the first aluminum layers 11 is 1.0 $\mu$m. Each second aluminum layer 12 is 1.1 $\mu$m wide and a distance between each of the second aluminum layers 12 is 0.8 $\mu$m.

The first aluminum layers 11 are used as a word line and a Vcc line that crosses arrays of SRAM cells.

In the SRAM cell, two metal lines of the second aluminum layer 12 are used as ground lines (Vss lines), and two other metal lines are used as bit lines or bit bar lines (B/L or B̄/L̄).

Bit lines in adjacent cells are separated by ground lines (Vss) in order to prevent the reduction of cell signals due to noise from capacitive coupling during a READ operation.

FIG. 2 is an equivalent circuit diagram of the conventional SRAM cell. As shown in FIG. 2, it takes six transistors to form a CMOS SRAM cell that uses a PMOS transistor as a loading device.

A source S1 of a first transistor Q1 is connected to the bit line, and a source S2 of a second transistor Q2 is connected to the bit bar line B̄/L̄.

Sources S6 and S5 of a sixth transistor Q6 and a fifth transistor Q5 (which is a PMOS transistor used as a loading device), respectively, are connected to the Vcc line.

A drain D5 of the fifth transistor Q5 is connected to a drain D3 of the third transistor Q3. A source S3 of a third transistor Q3 is connected to a Vss line.

A drain D6 of the sixth transistor Q6 is connected to a drain D4 of the fourth transistor Q4, and a source S4 of the fourth transistor Q4 is connected to a Vss line.

A gate G3 of the third transistor Q3 and a gate G5 of the fifth transistor Q5 are connected to each other. A gate G4 of the fourth transistor Q4 and a gate G6 of the sixth transistor Q6 are connected to each other.

A drain D1 of the first transistor Q1 is connected to gates G4 and G6 of the fourth and sixth transistors Q4 and Q6, respectively. A drain D2 of the second transistor Q2 is connected to the gates G3 and G5 of the third and fifth transistors Q3 and Q5, respectively.

A layout of the conventional SRAM cell will be described below.

FIG. 3 shows a layout of the conventional SRAM cell of FIG. 1 including elements of the SRAM cell of FIG. 2. As shown in FIG. 3, a first gate line 31 is formed in a first direction, and a second gate line 32 is formed at a right angle to the first gate line 31 and offset from the first gate line 31. A third gate line 33 is formed facing the second gate line 32.

The first gate line 31 is used as the gates G1 and G2 of the first and second transistors Q1 and Q2, and the second gate line 32 is used as the gates G3 and G5 of the third and fifth transistors Q3 and Q5. The third gate line 33 is used as gates G4 and G6 of the fourth and sixth transistors Q4 and Q6.

A first metal line 34 is formed to electrically connect the drain D5 of the fifth transistor Q5 to the drain D3 of the third Q3. A second metal line 35 is formed to electrically connect the drain D6 of the sixth transistor Q6 to the drain D4 of the fourth transistor Q4.

The second and third gate lines 32 and 33 are connected through contact holes to the second and first metal lines 35 and 34, respectively.

Reference numerals 36a, 36b, 36c, and 36d designate active regions of the transistors Q1–Q6.

The SRAM cell is formed on an n-type substrate. A p-type well is formed to form two PMOS transistors (the fifth and sixth transistors Q5 and Q6) used as a double loading device. Four NMOS transistors are formed in an n-type well.

The structure of the conventional SRAM cell has the following problems. Since four metal lines are needed, packing density of SRAM cells is low, and memory chip size is large. Further, since a distance between p well and n well needed for isolation is large, the packing density is low. Furthermore, since there are different Vss lines in the SRAM cell, ground line resistances of transistors connected to the Vss lines are also different.

SUMMARY OF THE INVENTION

Accordingly, the present invention is directed to a structure of an SRAM cell and a method for fabricating the same that substantially obviates one or more of problems due to limitations and disadvantages of the related art.

An object of the invention is to provide an SRAM cell and a method for fabricating the same in which the number of metal lines in a cell is minimized to increase the packing density, and Vss lines and Vcc lines in the cell are combined to improve the reliability.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and according to the purpose of the present invention, as embodied and broadly described, in one aspect of the present invention there is provided a CMOS SRAM cell, including a substrate divided by a well trench into an n well region and a p well region, first and second active regions each having a V shape, formed symmetrical relative to each other, and having the well trench in between, third and fourth active regions formed symmetrically relative to each other and offset from the second active region, first and second gate lines each crossing the first active region, the well trench, and the second active region, and a third gate line crossing the third and fourth active regions.

In another aspect of the present invention there is provided a method for fabricating a CMOS SRAM cell, including the steps of forming a well trench in a semiconductor substrate, implanting impurity ions to form p and n well regions, selectively forming isolating films on the p and n well regions to define a first active region in the n well region and second, third, and fourth active regions in the p well region, forming a first gate electrode crossing the first active region, the well trench, and the second active region and forming a second gate electrode crossing the third and fourth active regions, and forming a third gate electrode crossing the first active region, the well trench, and the second active region.

In another aspect of the present invention there is provided a CMOS SRAM cell, including a first active region formed in a semiconductor substrate and having a V shape, a second active region formed in the semiconductor substrate, wherein the second active region is substantially a mirror image of the first active about a first axis of symmetry, a third active region formed in the semiconductor substrate and offset from the first and second active regions, a fourth active formed in the semiconductor substrate, wherein the fourth active region is substantially a mirror image of the third active region about a second axis of symmetry, a first gate line crossing the third and fourth active regions, a second gate line crossing the first active region and the second active region and having a bow shape, a third gate line crossing the first active region and the second active region, wherein the first gate line is substantially a mirror image of the second gate about the first axis of symmetry, a Vcc line substantially parallel to the first electrode and connected to the first active region, a Vss line substantially parallel to the first electrode and connected to the second active region, a bit line connected to the third active region, and a bit bar line connected to the fourth active region.

In another aspect of the present invention there is provided a method of manufacturing a CMOS SRAM cell, including the steps of forming a well trench in a substrate, forming first, second, third and fourth active regions in the substrate, wherein the first active region has a V shape, wherein the second active region is a mirror image of the first active region about a first axis of symmetry, wherein the third and fourth active regions are offset from the first and second active regions, and wherein the third active region is a mirror image of the fourth active region about a second axis of symmetry, forming a first gate line crossing the third and fourth active regions and forming a second gate line crossing the first active region, the well trench, and the second active region, forming a third gate line crossing the first active region, the well trench, and the second active region, wherein the second gate line overlaps the third gate line over the well trench, forming a Vcc line substantially parallel to the first gate line and in contact with the first active region, connecting the second gate line to the third active region, connecting the third gate line to the fourth active region, forming a Vss line substantially parallel to the first gate line and connected to the second active region, connecting the third gate line to a first portion of the first active region and a first portion of the second active region, and connecting the second gate line to a second portion of the first active region and a second portion of the second active region, and forming a bit line connected to the third active region, and a bit bar line connected to the fourth active region.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention.

Figure 5A:
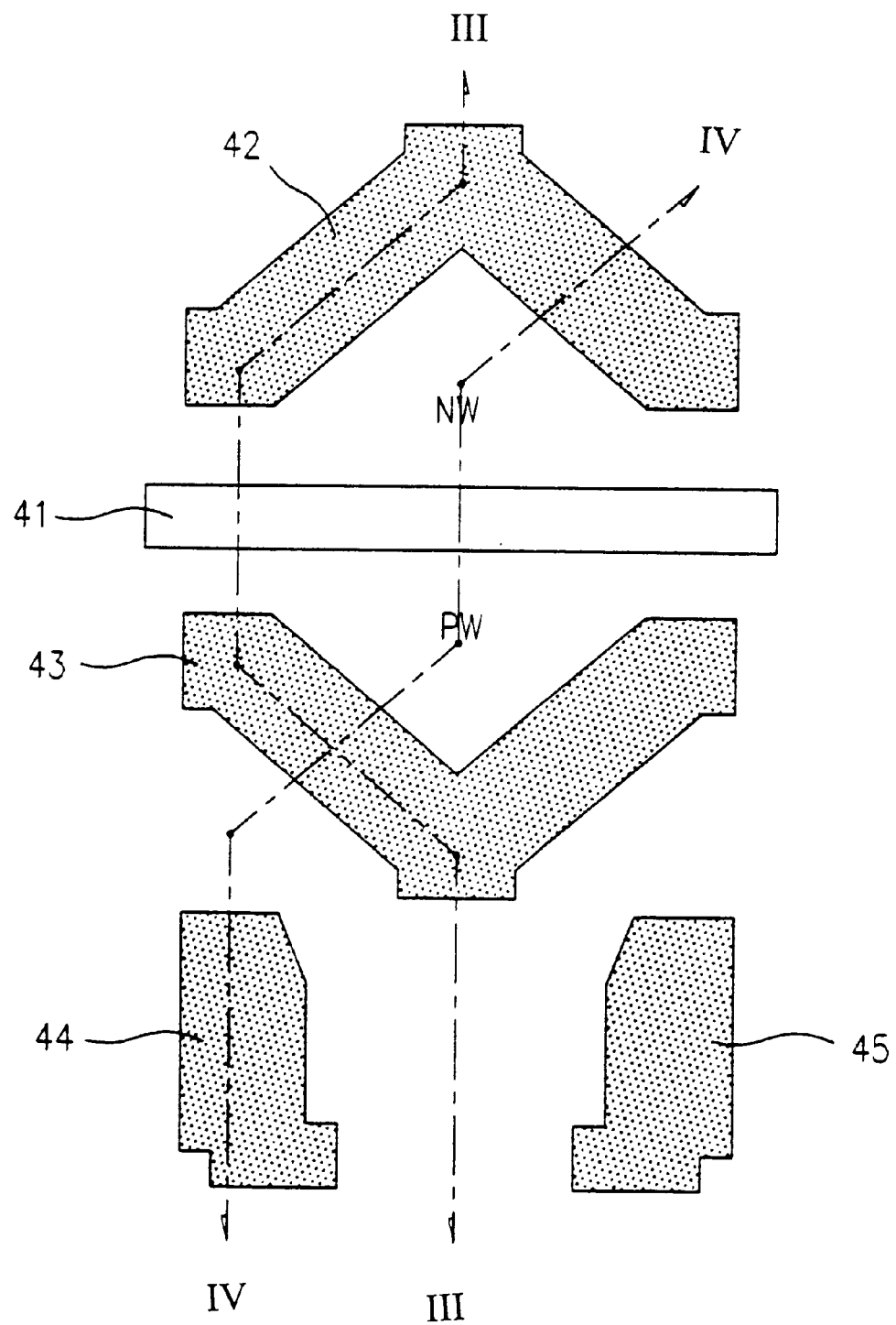
FIGS. 5A to 5C are layouts showing process steps of the SRAM cell of FIG. 4A.
Figure 5B:
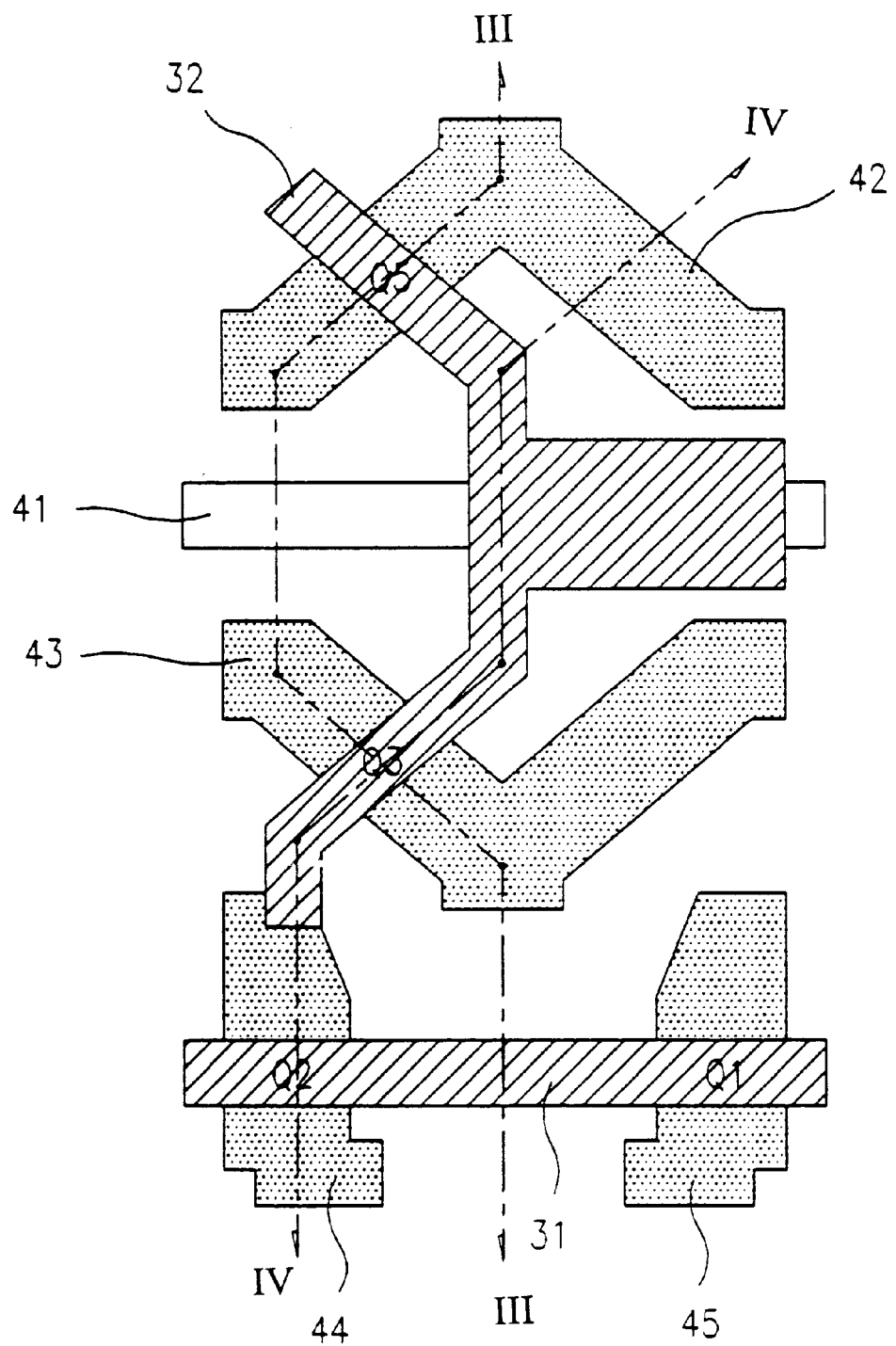
Figure 5C:
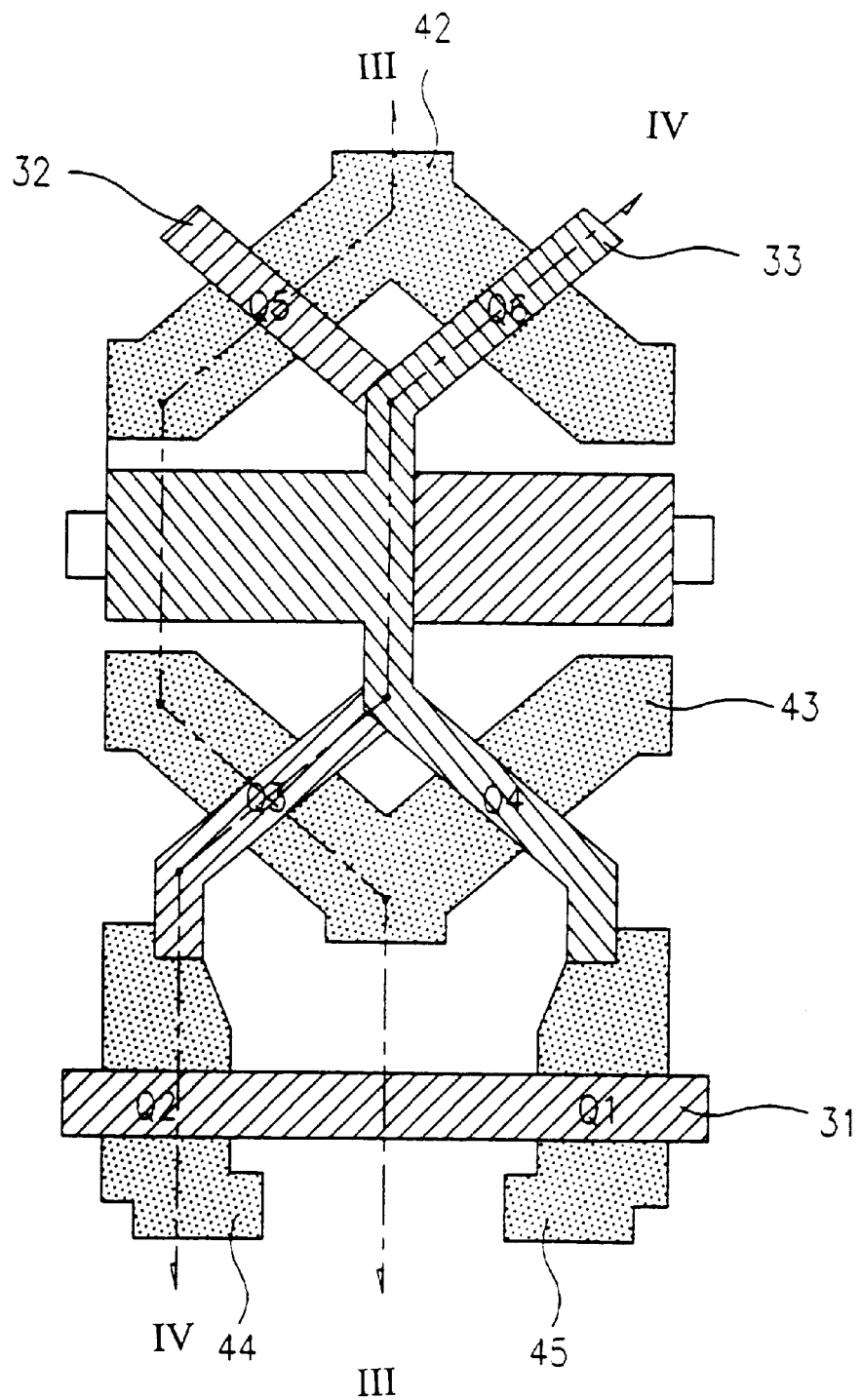
Figure 6A:
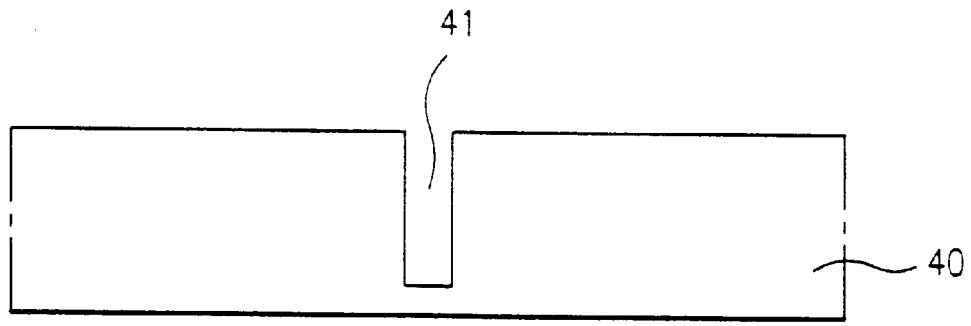
FIGS. 6A to 6O are cross-sectional views of process steps of the SRAM cell, along line III—III of FIGS. 5A to 5C.
Figure 6A:
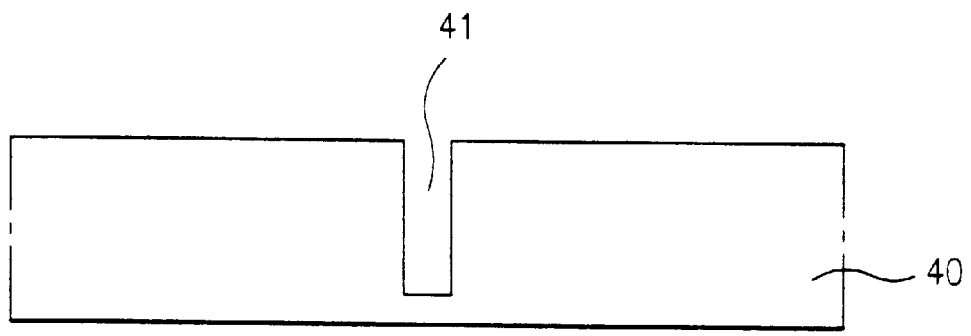
Figure 6B:
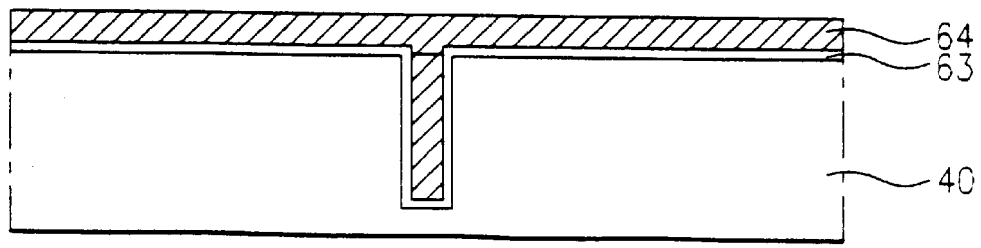
Figure 6B:
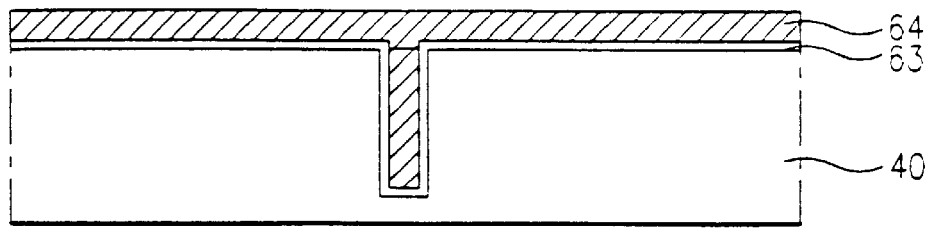
Figure 6C:
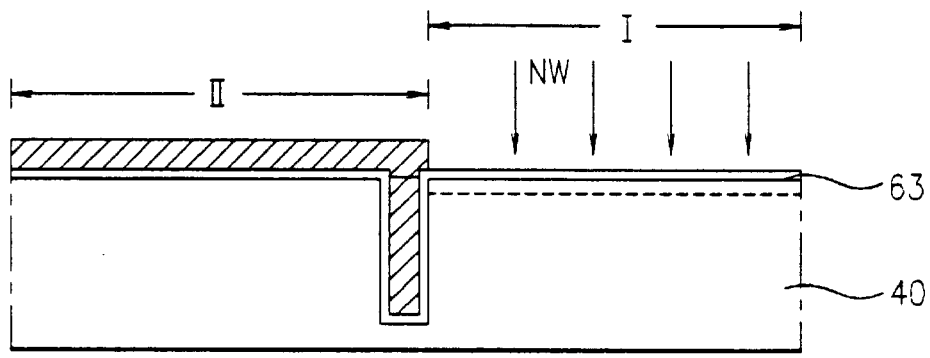
Figure 6C:
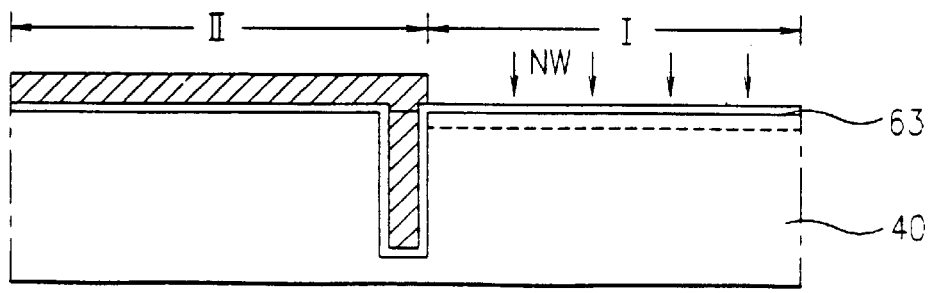
Figure 6D:
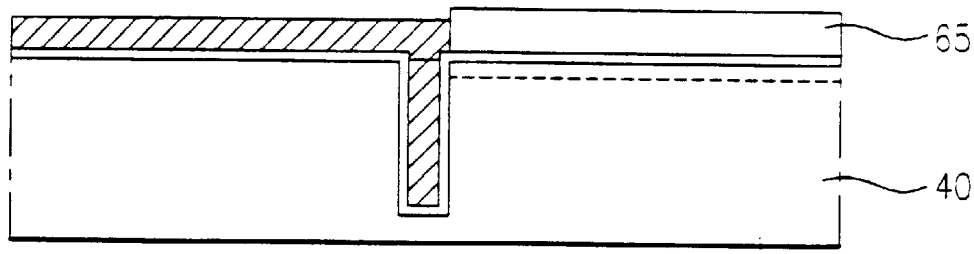
Figure 6D:
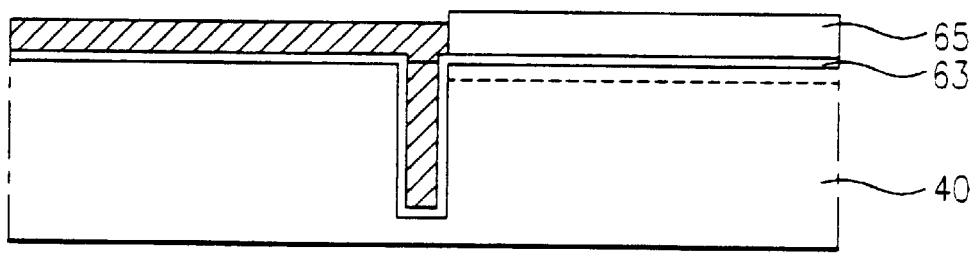
Figure 6E:
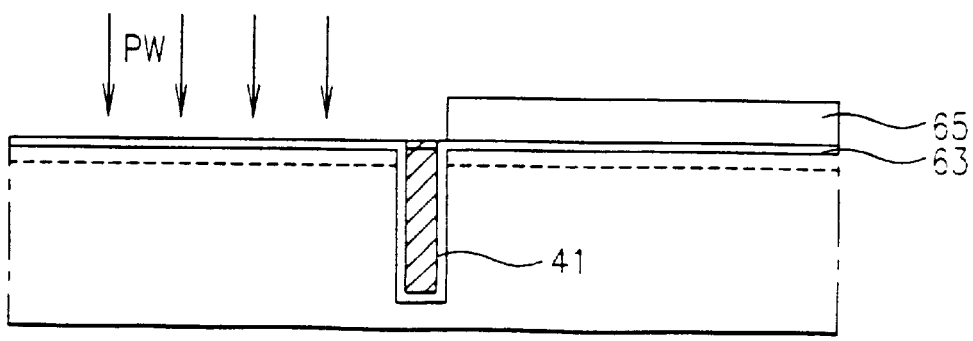
Figure 6E:
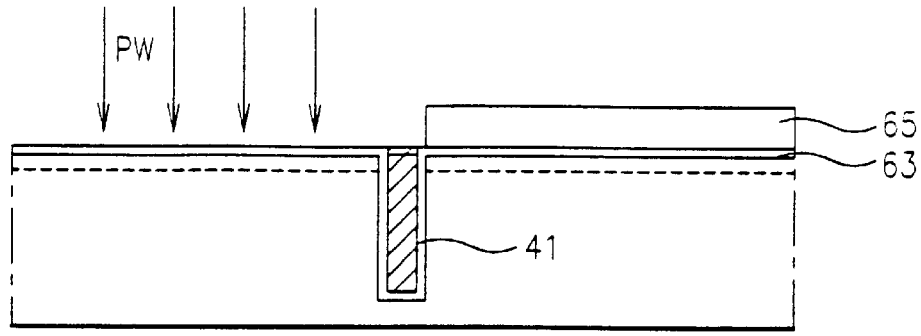
Figure 6F:
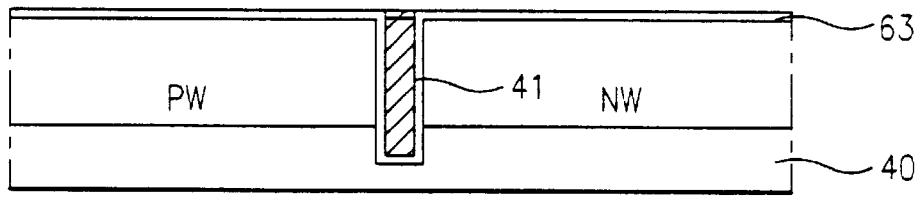
Figure 6F:
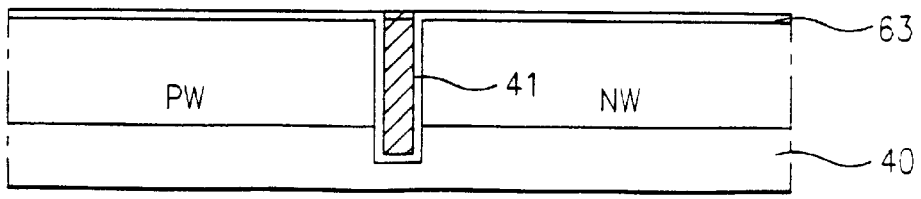
Figure 6G:
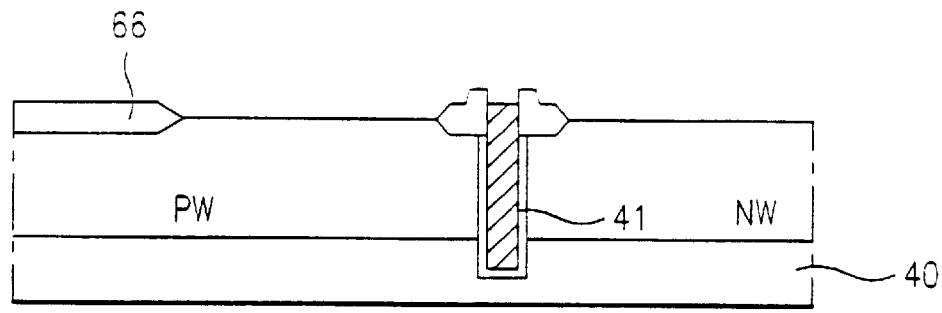
Figure 6G:
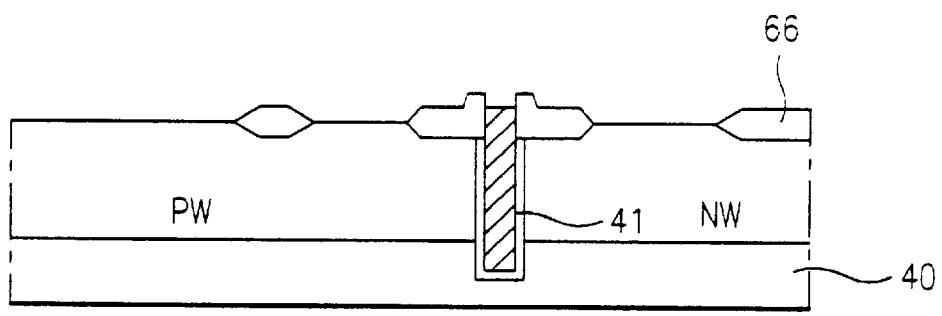
Figure 6H:
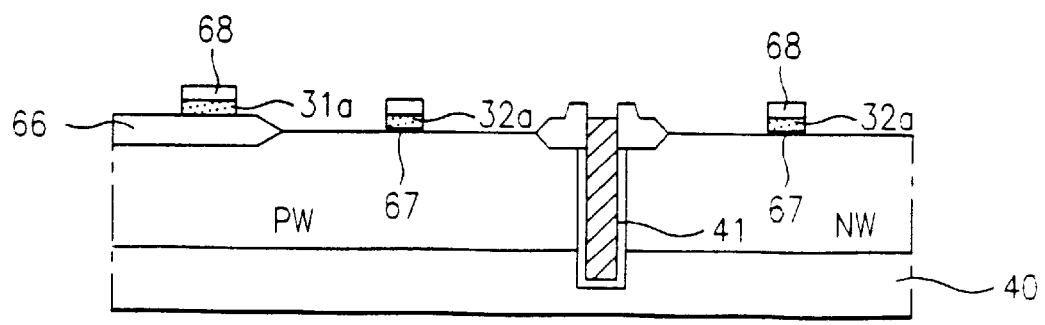
Figure 6H:
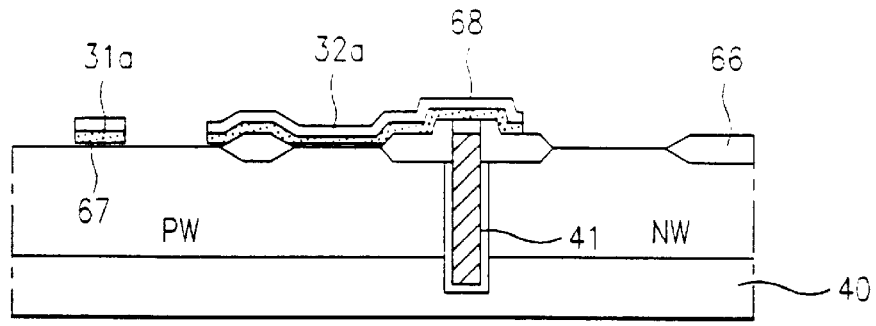
Figure 6I:
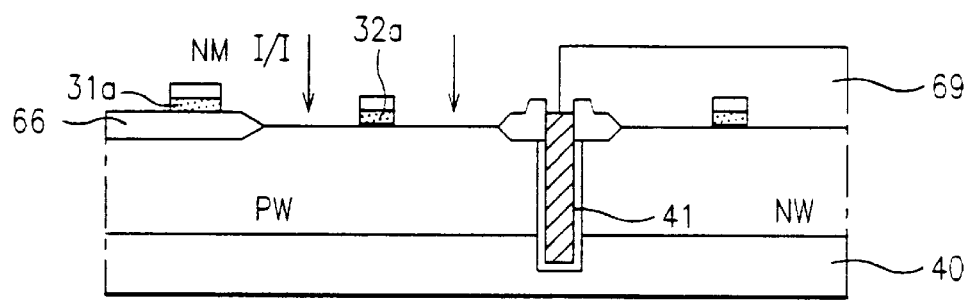
Figure 6I:
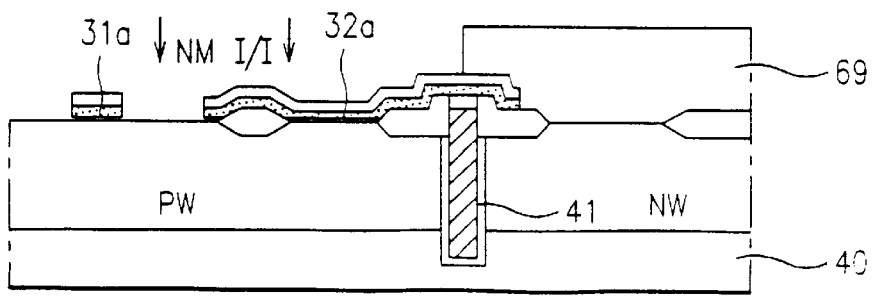
Figure 6J:
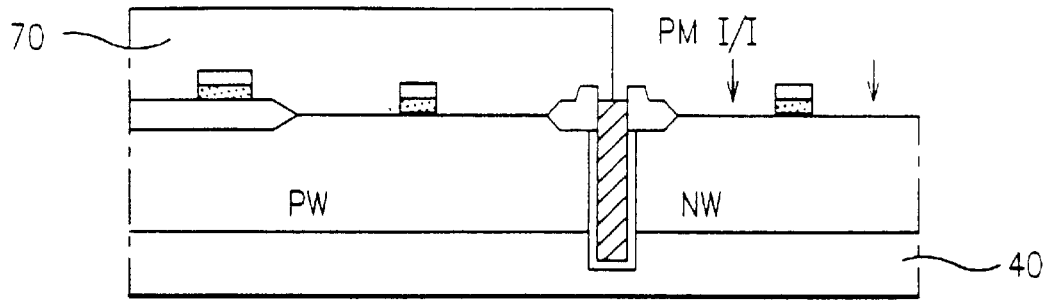
Figure 6J:
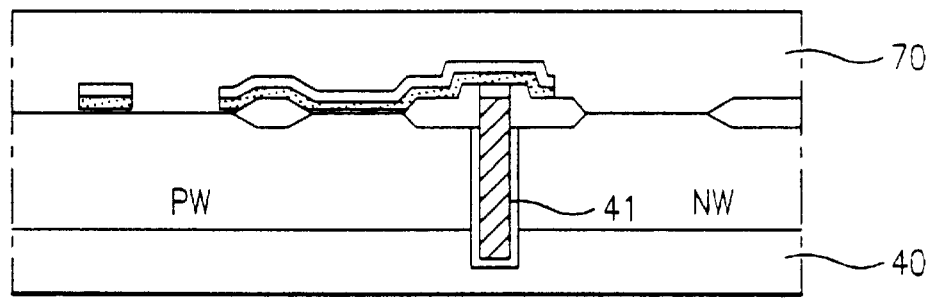
Figure 6K:
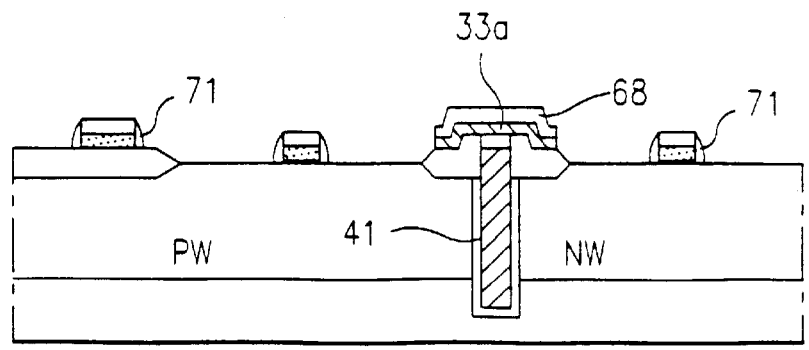
Figure 6K:
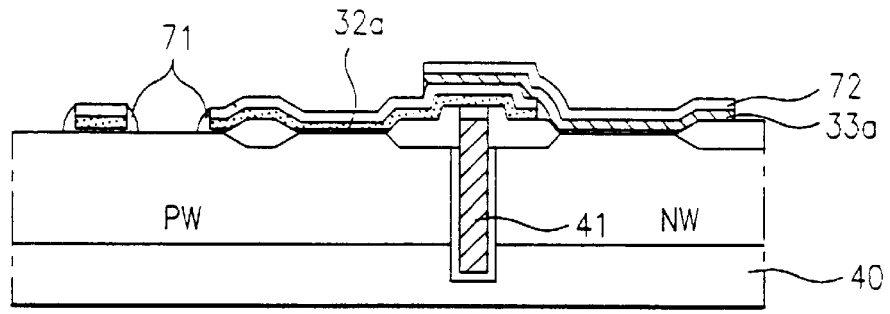
Figure 6L:
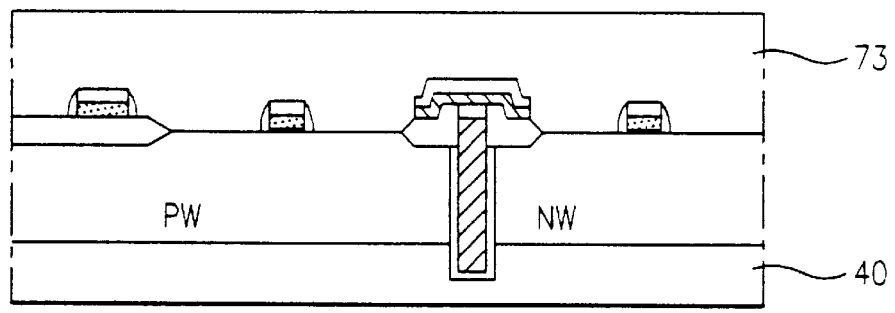
Figure 6L:
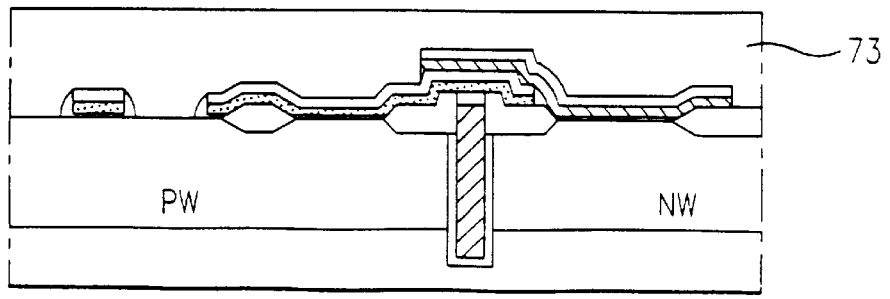
Figure 6M:
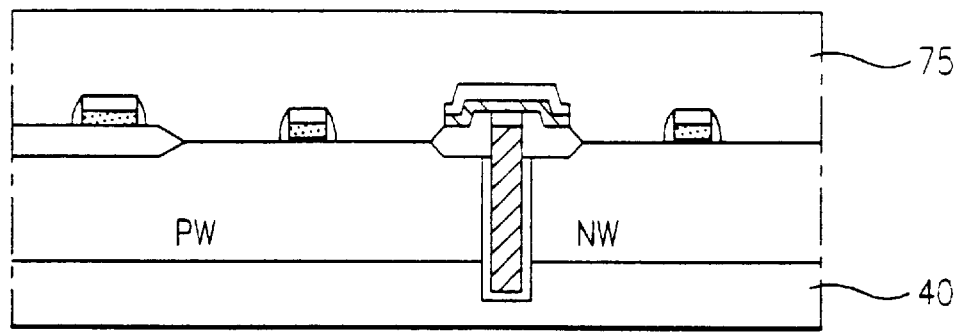
Figure 6M:
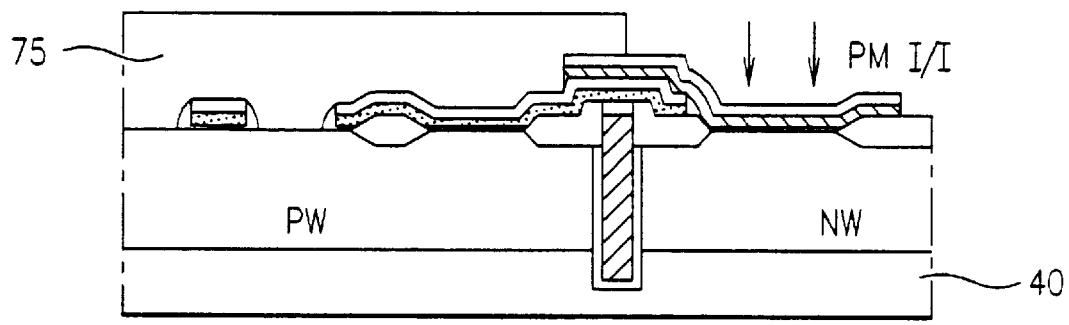
Figure 6N:
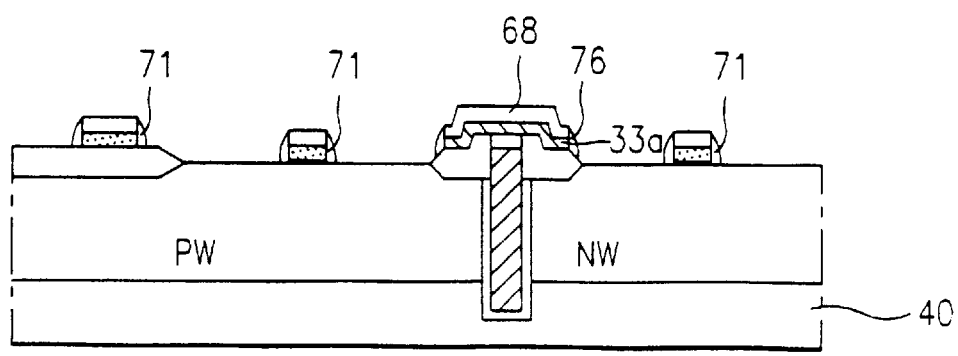
Figure 6N:
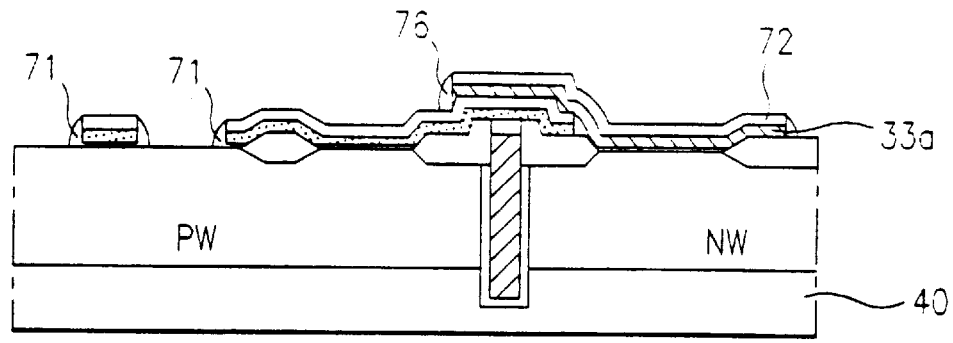
Figure 6O:
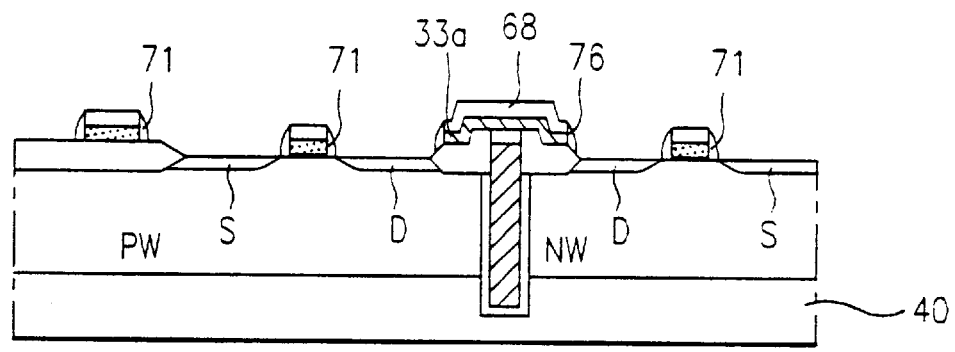
Figure 6O:
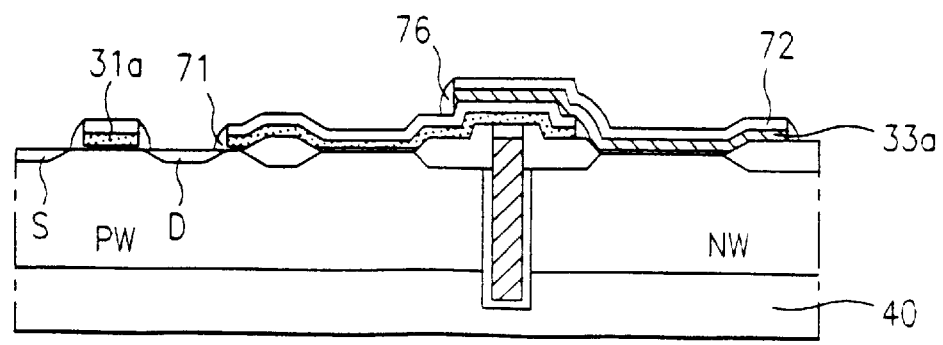
Figure 8:
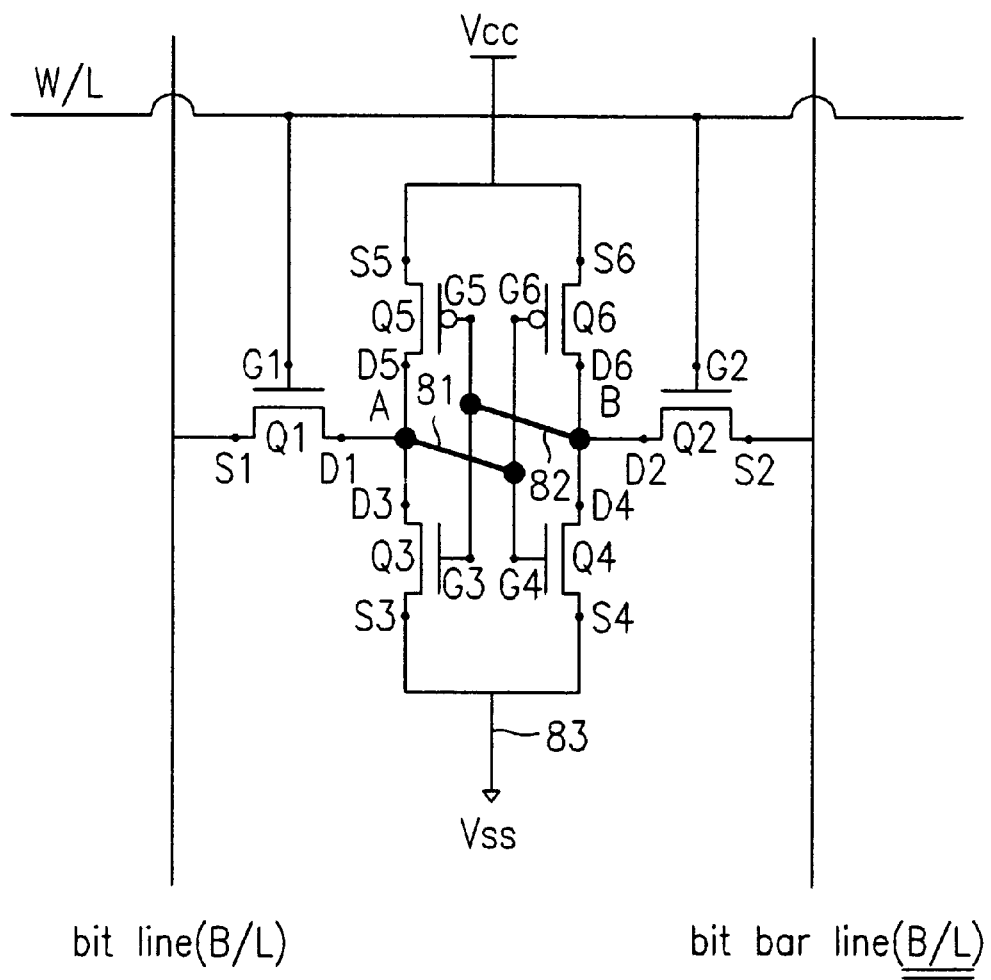
Figure 9A:
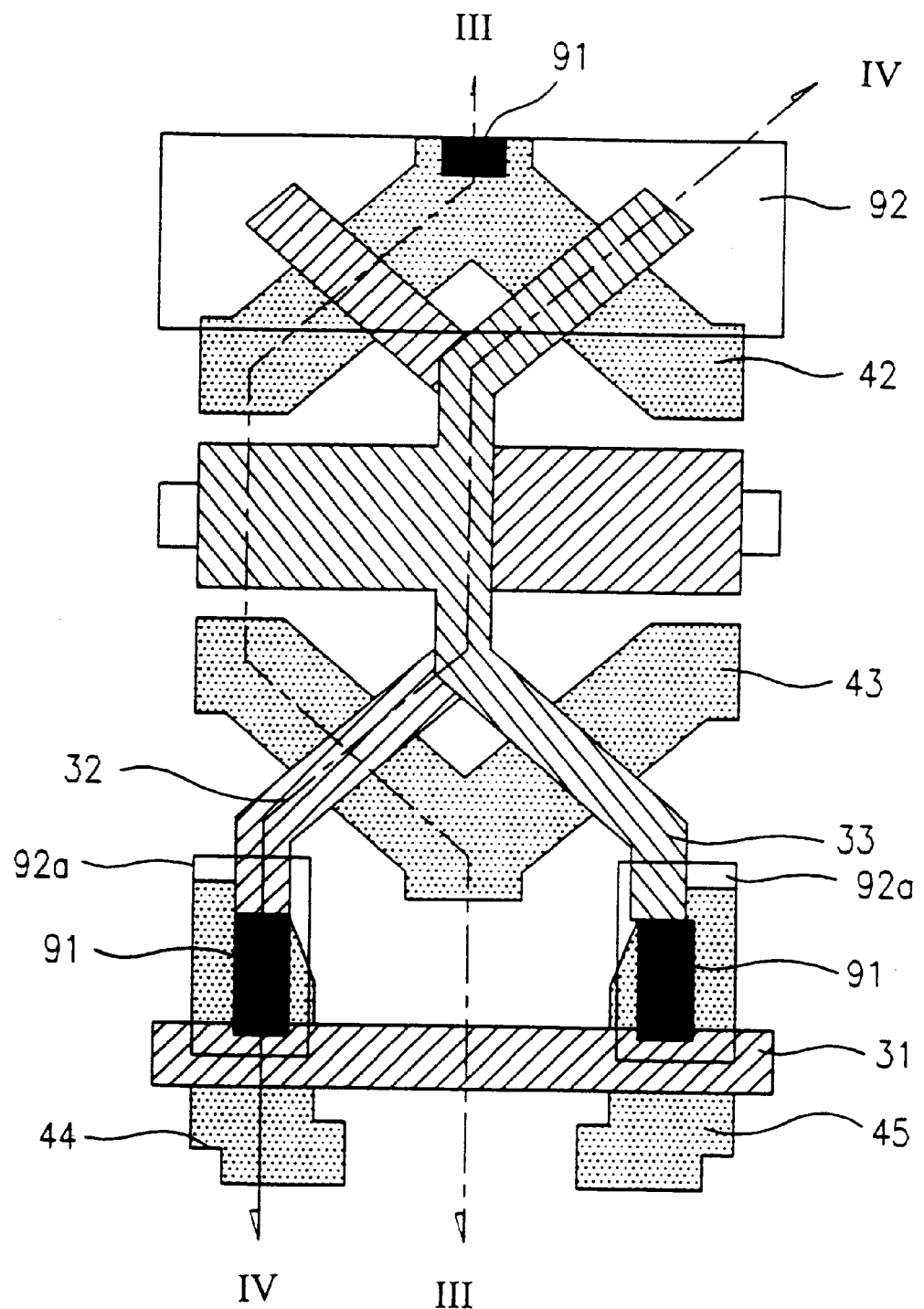
Figure 9B:
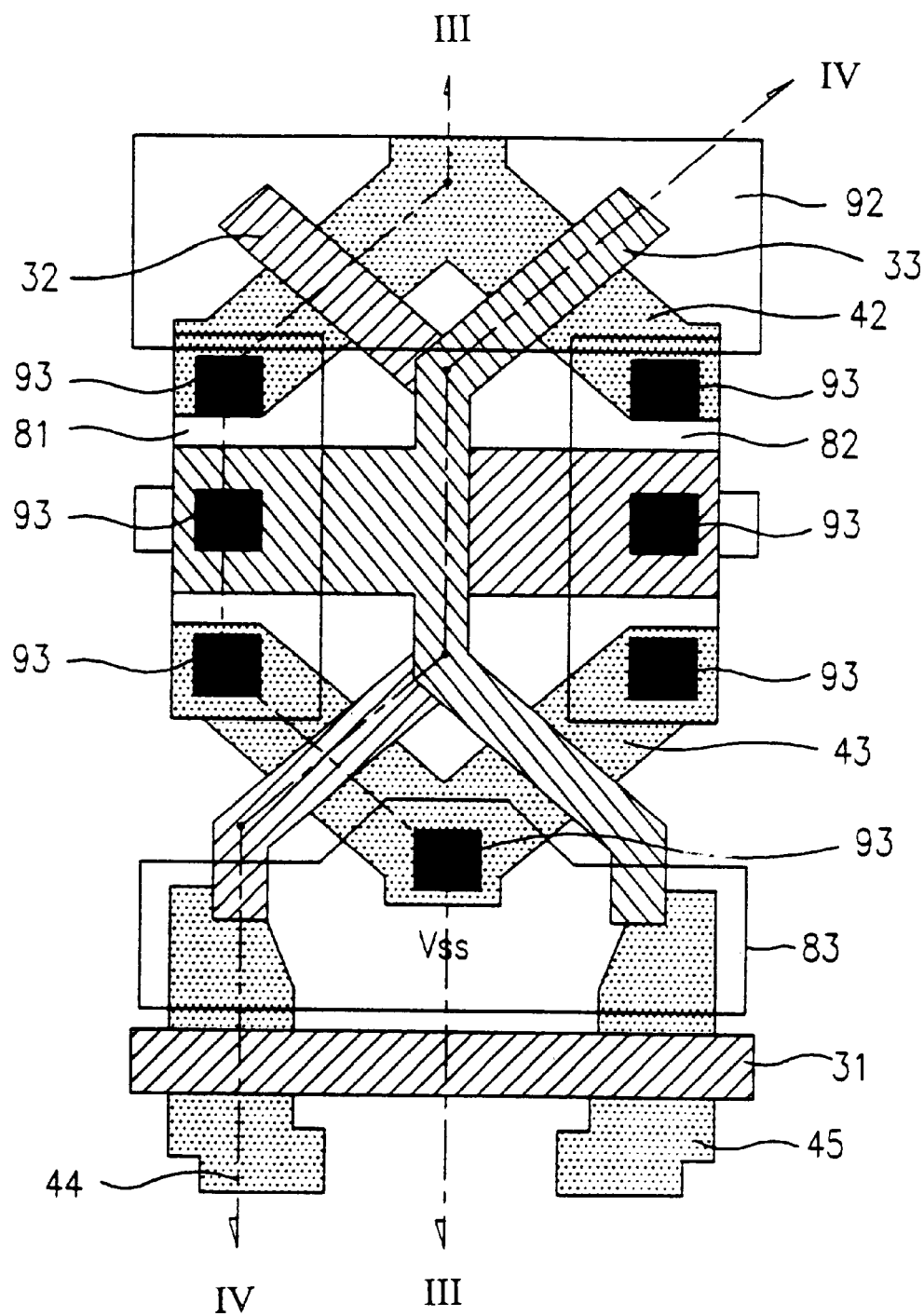
Figure 9C:
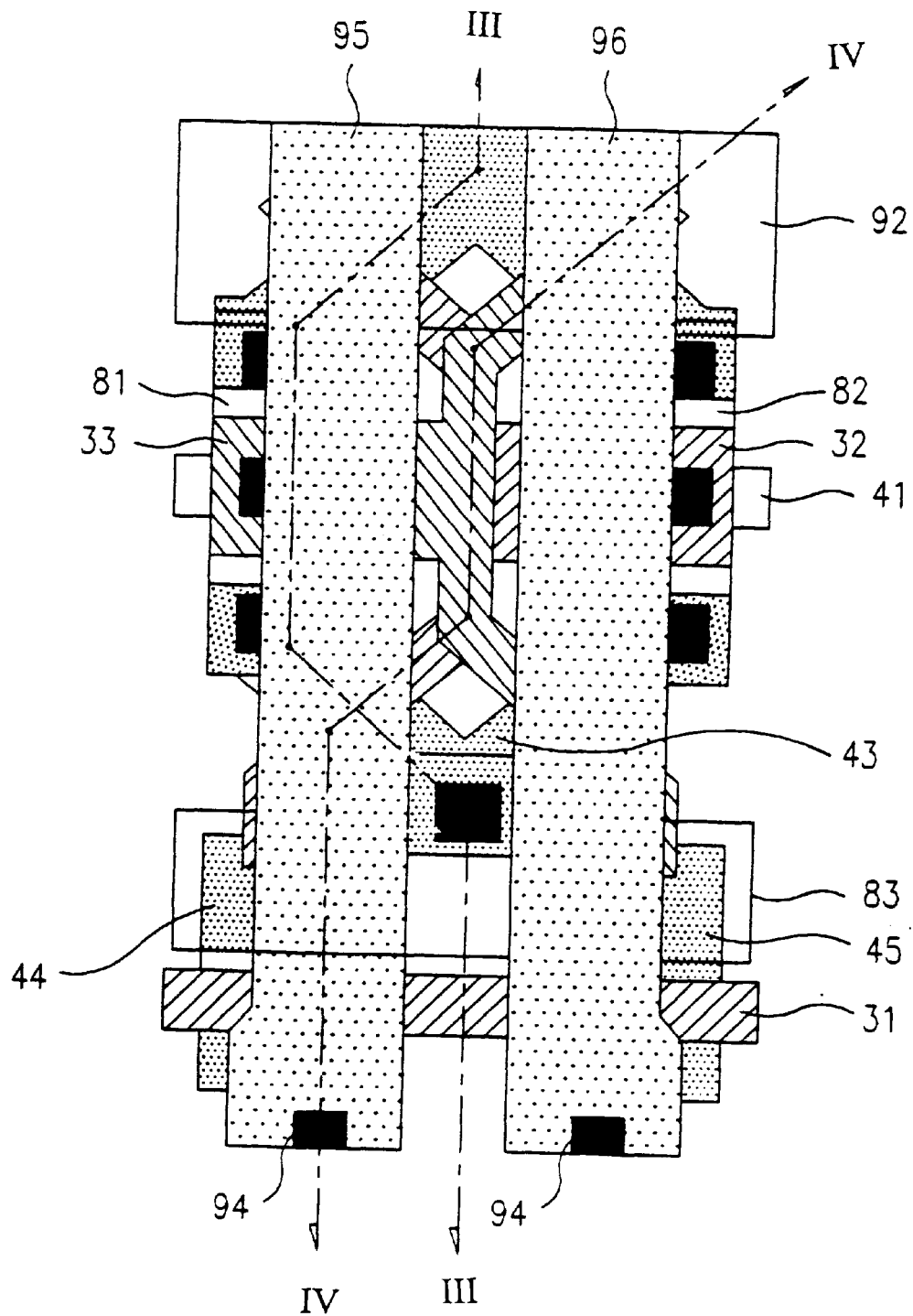
Figure 10A:
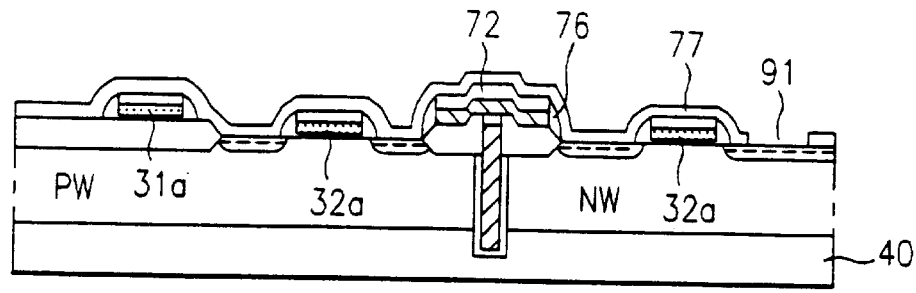
Figure 10A:
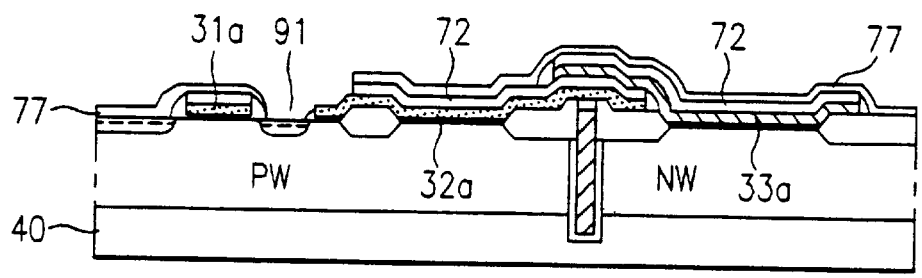

FIGS. 6A' to 6O' are cross-sectional views of process steps of the SRAM cell, along line IV—IV of FIGS. 5A to 5C;

FIGS. 7A to 7D show photoresist patterns by NMOS and PMOS ion implantations in fabricating the SRAM cell of the present invention;

FIG. 8 is an equivalent circuit diagram of the SRAM cell of the present invention;

FIGS. 9A to 9C are layouts showing process steps following the step shown in FIG. 5C;

FIGS. 10A to 10F are cross-sectional views showing the process steps following the steps shown in FIGS. 6A to 6O; and FIGS. 10A' to 10F' are cross-sectional views showing the process steps following the steps shown in FIGS. 6A' to 6O'.

DETAILED DESCRIPTION OF THE PREFERRED EMBODIMENTS

Reference will now be made in detail to the preferred embodiments of the present invention, examples of which are illustrated in the accompanying drawings.

Figure 1:
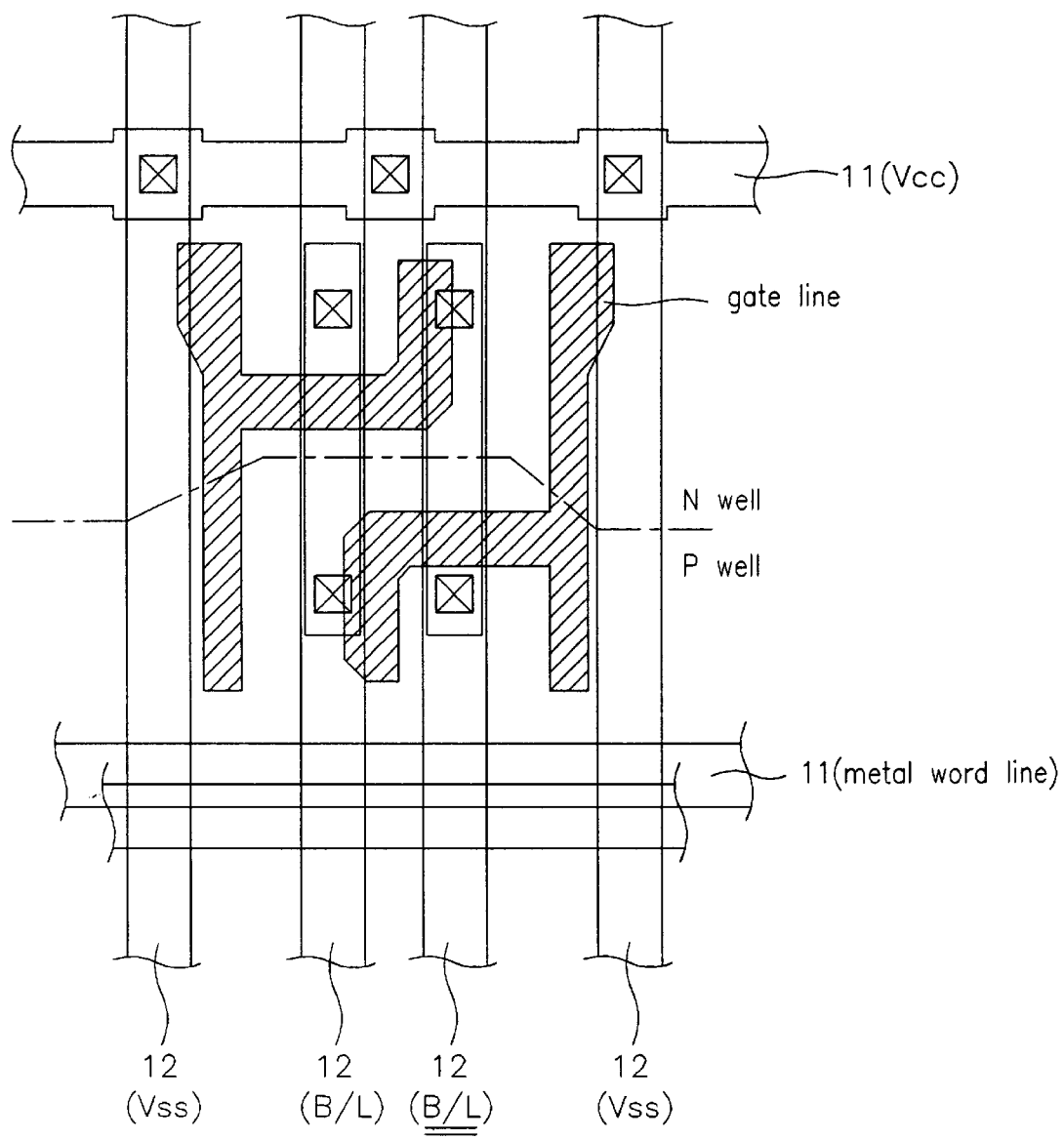
FIG. 1 is a layout of a conventional SRAM cell.
Figure 2:
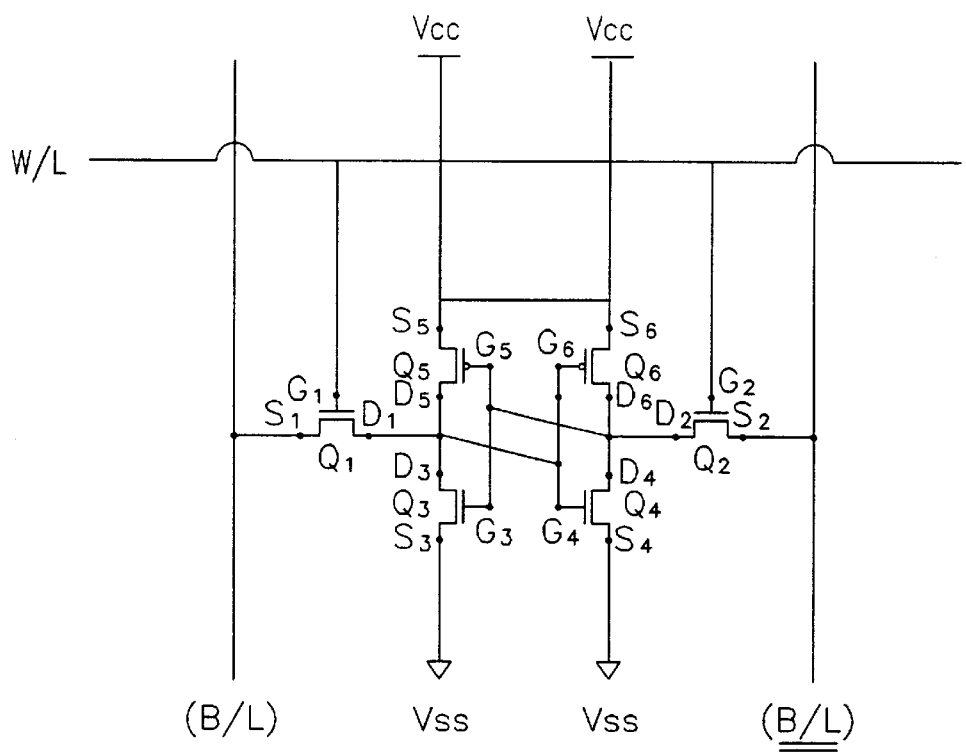
FIG. 2 is an equivalent circuit diagram of the conventional SRAM cell.
Figure 3:
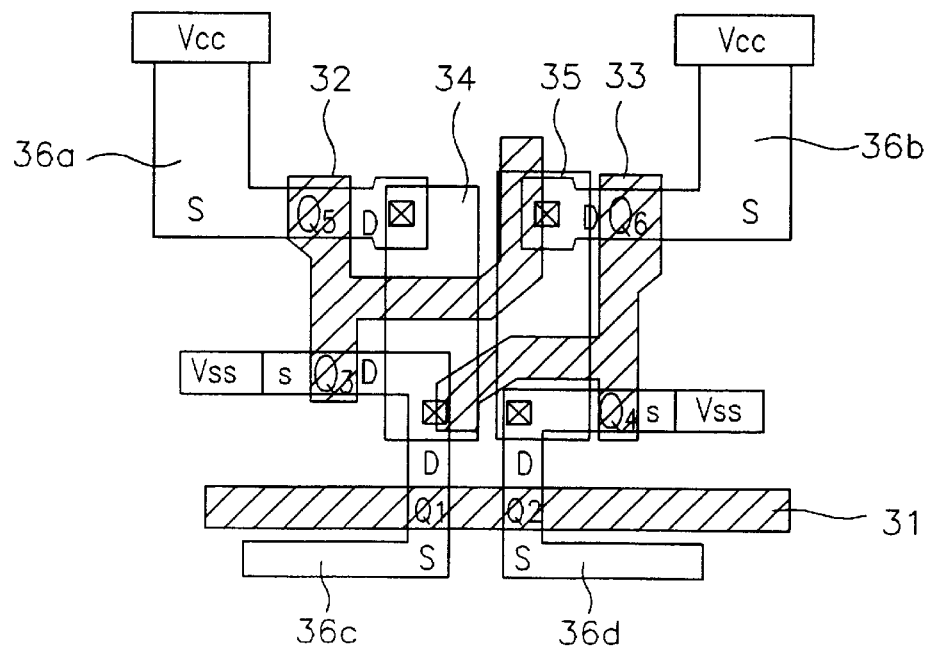
FIG. 3 is a layout showing specific elements of the conventional SRAM cell.
Figure 4A:
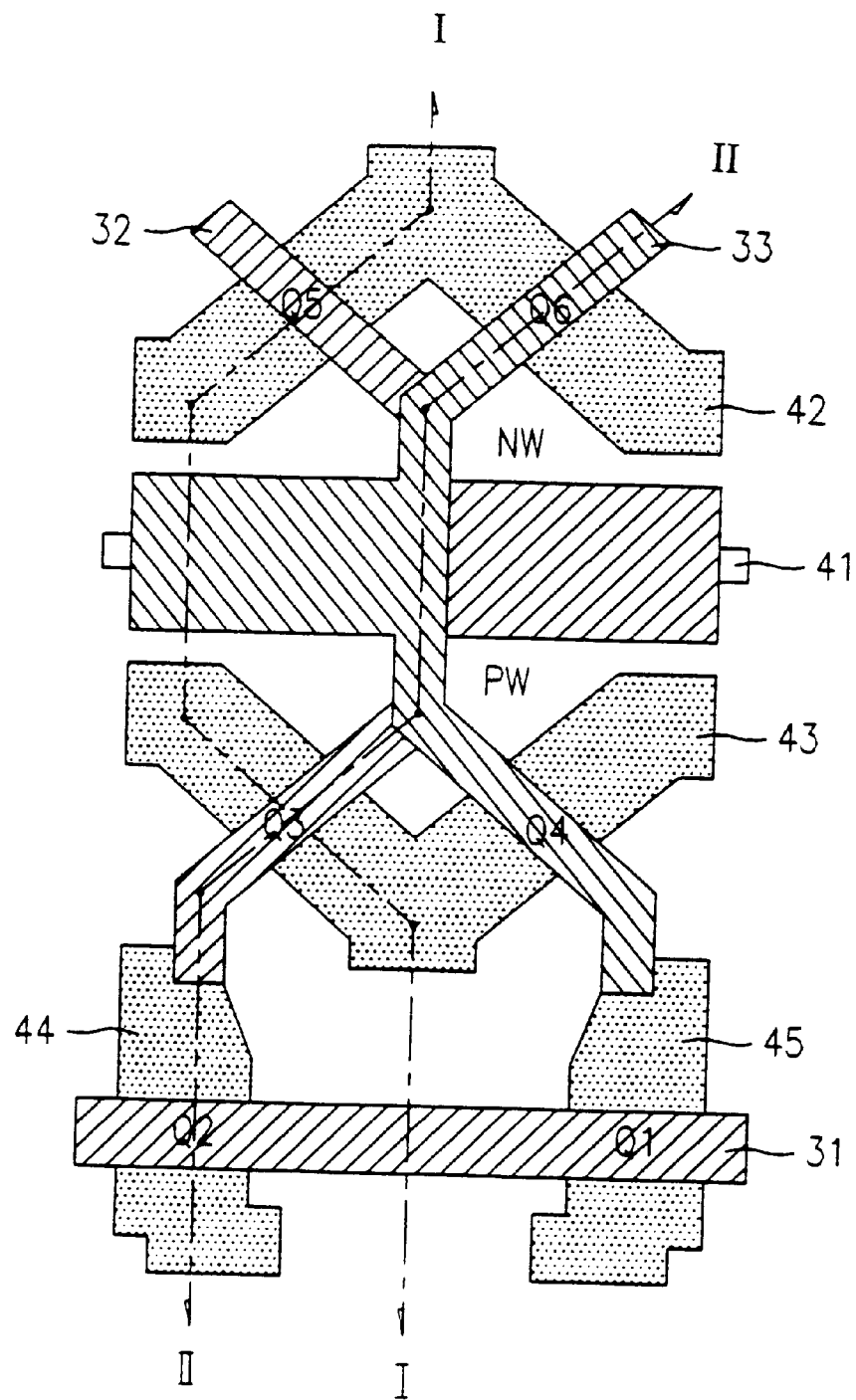
FIG. 4A is a layout showing elements of an SRAM cell according to the present invention.
Figure 4B:
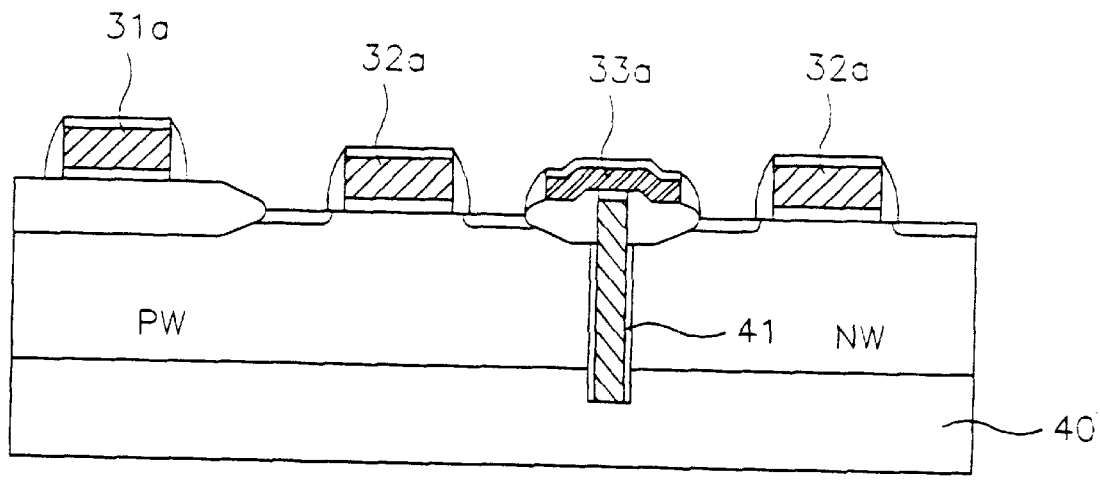
FIG. 4B is a cross-sectional view of an SRAM cell along line I—I of FIG. 4A.
Figure 4C:
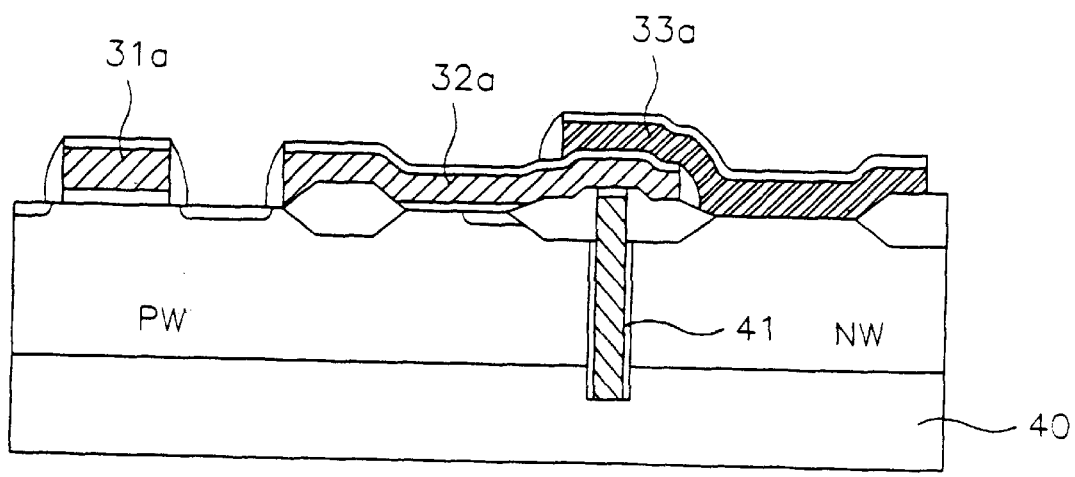
FIG. 4C is a cross-sectional view of an SRAM cell taken along line II—II of FIG. 4A.

FIG. 4A is a layout showing elements of an SRAM cell of the present invention. FIG. 4B is a cross-sectional view of the SRAM cell along line I—I of FIG. 4A, and FIG. 4C is a cross-sectional view of the SRAM cell along line II—II of FIG. 4A. In FIGS. 4A to 4C, a wiring process is not performed.

As shown in FIG. 4A, the SRAM cell includes p and n well regions PW and NW separated by a well trench 41. First and second active regions 42 and 43 face the well trench 41 in the p and n well regions PW and NW, respectively. Third and fourth active regions 44 and 45 face each other and are formed at one side of the second active region 43, wherein a field region is located between the third and fourth active regions 44 and 45. A first gate line 31 crosses the third and fourth active regions 44 and 45. A second gate line 32 is shaped like a bow and crosses the first active region 42, the well trench 41, the second active region 43, and the third active region 44. A third gate line 33 has the same shape as the second gate line 32 (i.e. is a mirror image of the second gate line 32 about a first axis of symmetry, which is vertical) and crosses the first active region 42, the well trench 41, the second active region 43, and the fourth active region 45. The second gate line 32 overlaps the third gate line 33 at least over the well trench 41.

As shown in FIG. 4B, the SRAM cell includes a semiconductor substrate 40, p and n well regions PW and NW separated from each other by a well trench 41 formed in the semiconductor substrate 40, a first gate electrode 31a formed on a field region of the p well region PW, second gate electrodes 32a formed on active regions of the p and n well regions PW and NW, and a third gate electrode 33a formed on an insulating film on the well trench 41.

The second gate electrodes 32a are formed integrally on active regions of the p and n well regions PW and NW.

The first, second, and third gate electrodes 3 la, 32a, and 33a are formed out of the first, second, and third gate electrode lines 31, 32, and 33, respectively.

As shown in FIG. 4C showing cross-sectional views along the line II—II of FIG. 4A, the SRAM cell includes the semiconductor substrate 40, the p and n well regions PW and NW separated by the well trench 41 formed in the semiconductor substrate 40, the first gate electrode 31a formed on the active region of the p well region PW, the second gate electrode 32a formed on the n well region NW and the well trench 41, and the third gate electrode 33a formed on the well trench 41 and the n well region NW and offset from the first gate electrode 31a.

The second gate electrode 32a overlaps the third gate electrode 33a at least on the well trench 41.

The first, second, and third gate electrodes 31a, 32a, and 33a are formed of the first, second, and third gate lines 31, 32, and 33, respectively.

A method for fabricating an SRAM cell having the above structure will be described.

FIGS. 5A to 5C are layouts showing fabrication process steps of the SRAM cell of FIG. 4A.

Referring initially to FIG. 5A, the well trench 41 is formed to a predetermined depth in a semiconductor substrate. Ions are implanted to form the p and n well region PW and NW at both sides of the well trench 41 (not shown in FIG. 5A). A first active region 42 having a V shape is S formed in the n well region NW. A second active region 43 having the same shape as the first active region 42 is formed in the p well region PW (i.e. the second active region 43 is a mirror image of the first active region 42 about an axis of symmetry, which is horizontal). The third and fourth active regions 44 and 45 are formed offset from the second active region 43.

As shown in FIG. 5B, a first polysilicon layer is deposited on the entire surface including the well trench 41 and is then selectively removed to form the first gate line 31 crossing the third and fourth active regions 44 and 45, the second gate line 32 having a bow shape and crossing the first active region 42, the well trench 41, and the second active region 43 are formed. The second gate line 32 on the well trench 41 extends in one direction over the well trench 41.

As shown in FIG. 5C, a second polysilicon layer is deposited on an entire surface including the first and second gate lines 31 and 32, and is then patterned to form the third gate line 33, which is a minor image of the second gate line 32 and overlaps the second gate line 32 at least on the well trench 41. Thus, the well trench 41 is covered by the second and third gate lines 32 and 33.

The method for fabricating the SRAM cell of the present invention will be described with reference to cross-sectional views of FIGS. 6A to 6O showing process steps of the SRAM cell, taken along line III—III of FIGS. 5A to 5C, and FIGS. 6A' to 6O' showing process steps of the SRAM cell, taken along line IV—IV of FIGS. 5A to 5C.

Referring initially to FIGS. 6A and 6A', the semiconductor substrate 40 is etched to a predetermined depth, forming a well trench 41 that defines p and n well regions.

Referring to FIGS. 6B and 6B', a first insulating layer 63 is formed on the surface of the semiconductor substrate 40 including the well trench 41, and a second insulating film 64 is formed on the first insulating layer 63 filling the well trench 41.

Referring to FIGS. 6C and 6C', a first photoresist film is coated on the second insulating layer 64 and is exposed and developed to define first and second regions I and II. Using the first photoresist film as a mask, the second insulating layer 64 in the first region I is etched to expose the first insulating film 63. In the first and second regions, n and p wells are formed, respectively. An ion-implanting process is carried out into the first region to form an n well.

Referring to FIGS. 6D and 6D', a third insulating film 65 is formed on the exposed first insulating film 63. Then the second insulating film 64 in the second region is removed as shown in FIGS. 6E and 6E'. Then an ion-implanting process is carried out to form a p well.

Referring to FIGS. 6F and 6F', a drive-in diffusion process is carried out to form n and p wells NW and PW to a predetermined depth. Then the third insulating layer 65 in the first region is removed. The n and p wells NW and PW have similar depths which is less than a depth of the well trench 41.

Referring to FIGS. 6G and 6G', a local oxidation of silicon (LOCOS) process is carried out to form device-isolating films 66. In the LOCOS process, a nitride film (not shown) is first coated on the entire surface of the semiconductor substrate 40 including the well trench 41. Then a photoresist film (not shown) is coated on the nitride film and is patterned. Using the patterned photoresist film as a mask, the nitride film and the first insulating layer 63 are selectively etched to expose the surface of the semiconductor substrate 40. An ion-implanting process is carried out over the exposed semiconductor substrate 40. An annealing process is carried out to form a plurality of device-isolating films 66. Then the nitride film is removed.

Transistors are formed on the semiconductor substrate 40 where well trenches 41 and device-isolating films 66 are formed.

FIGS. 6H and 6J are cross-sectional views taken along the line III—III of FIG. 5B, and FIGS. 6H' and 6J' are cross-sectional views taken along the line IV—IV of FIG. 5B.

As shown in FIG. 5B, the well trench 41, and the first to fourth active regions 42–45 are formed, and the first gate electrode 31a is formed crossing the third and fourth active regions 44 and 45. The second gate electrode 32a having a bow shape is formed crossing the first and second active regions 42 and 43, as described below with reference to cross-sectional views.

Referring to FIGS. 6H and 6H', a gate insulating film 67 is formed on the semiconductor substrate 40. Next, a first polysilicon layer and a cap insulating film 68 are deposited on the entire surface including the device-isolating films 66 and are then patterned to form the first and second gate electrodes 31a and 32a. That is, the gate insulating film 67 is formed on the entire surface of the semiconductor substrate 40 including the well trench 41, and the first polysilicon layer and the first cap insulating layer 68 are formed on the gate insulating film 67. A photo etching process is carried out to selectively remove the first polysilicon layer and the first cap insulating layer 68, thereby forming first and second gate electrodes 31a and 32a.

While the first gate electrode 31a is formed on the device-isolating film 66 of the p well region PW, the second gate electrode 32a is formed on the active region. A gate electrode is formed on the active region of the n well region NW and has an integrated form with the second process is carried out to form the NMOS transistor Q4 in the p well region and the PMOS transistor Q6 in the n well region. Likewise, two processes of patterning polysilicon layers and two processes of implanting impurity ions are performed in the two PMOS transistors Q5 and Q6 and the four NMOS transistors Q1 to Q4. After finishing a first ion-implanting process, a second ion-implanting process is performed to change a threshold voltage. For this reason, the p well region is partially exposed.

Thereafter, an n-type ion-implanting process is carried out.

Referring to FIGS. 6J and 6J', the second photoresist film 69 is removed and a third photoresist film 70 is then coated on the entire surface. Next, a portion of the n-well region is selectively exposed.

As shown in FIG. 6J', taken along the line IV—IV of FIG. 5B, the third photoresist film 70 is masked over the p and n well regions.

As described above, the first polysilicon layer is deposited and then patterned to form the first and second gate electrodes 31a and 32a.

As described below, a second polysilicon layer is deposited and patterned to form the third gate electrode 33a.

FIGS. 6K to 6O are cross-sectional views of fabrication process steps along the line of III—III of FIG. 5C and FIGS. 6K' to 6O' are cross-sectional views of fabrication process steps along the line IV—IV of FIG. 5C.

Referring to FIGS. 6K and 6K', a fourth insulating layer is formed on the entire surface of the semiconductor substrate 40 including the first and second gate electrodes 31a and 32a and is then etched-back to form first sidewall spacers 71 on both sides of the first and second gate electrodes 31a and 32a.

Subsequently, a second polysilicon layer and a second cap insulating film 72 are deposited on the entire surface of the semiconductor substrate 40 including the first and second gate electrodes 31a and 32a.

As shown in FIG. 6K, a photo etching process is carried out to selectively remove the second cap insulating film and the second polysilicon layer, forming the third gate electrode 33a over the well trench 41.

As shown in FIG. 6K', the third gate electrode 33a overlaps the second gate electrode 32a over the well trench 41. The third gate electrode 33a forms a PMOS transistor Q6 in the n well region and an NMOS transistor Q4 in the p well region. Thereafter, an ion-implanting process is carried out to define gates that will be formed in the n and p well regions.

That is, as shown in FIGS. 6L and 6L', a fourth photoresist film 73 is coated on the entire surface of the semiconductor substrate 40 including the third gate electrode 33a. An exposure and development process is carried out to pattern the fourth photoresist film 73 to expose the p well region.

As shown in FIG. 6L taken along the line of III—III' of FIG. 5C, the fourth photoresist film 73 masks the entire semiconductor substrate 40.

Figure 7A:
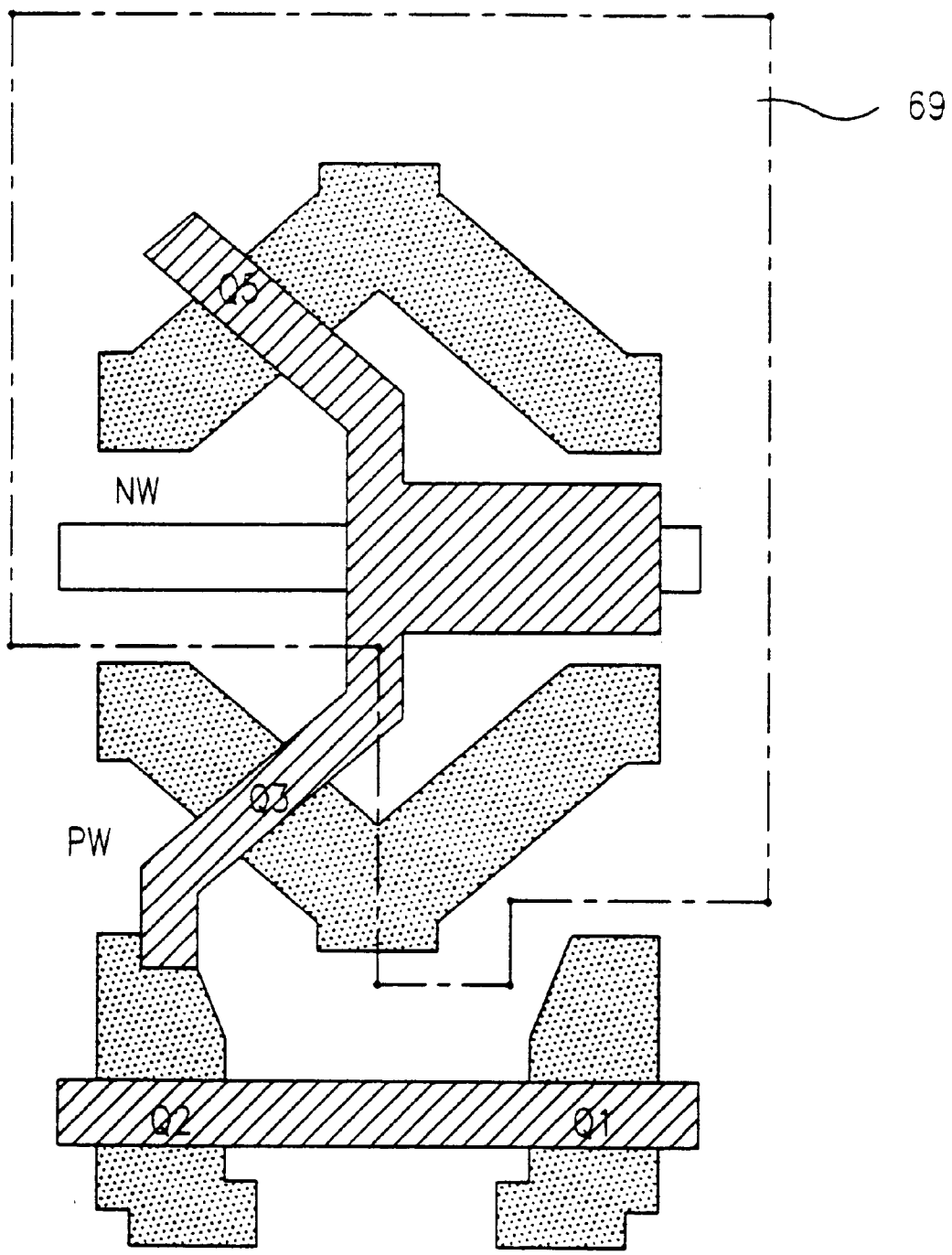
Figure 7B:
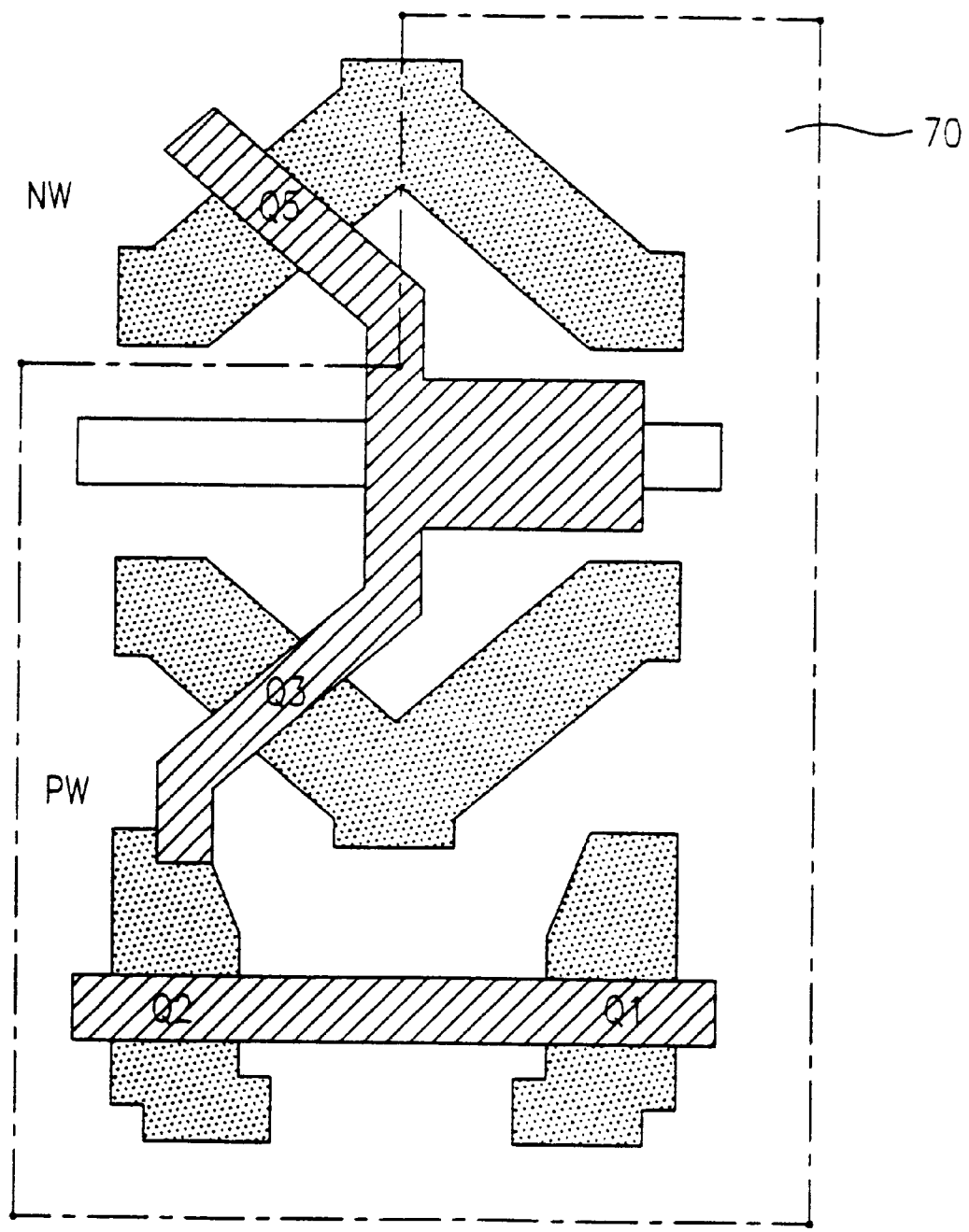
Figure 7C:
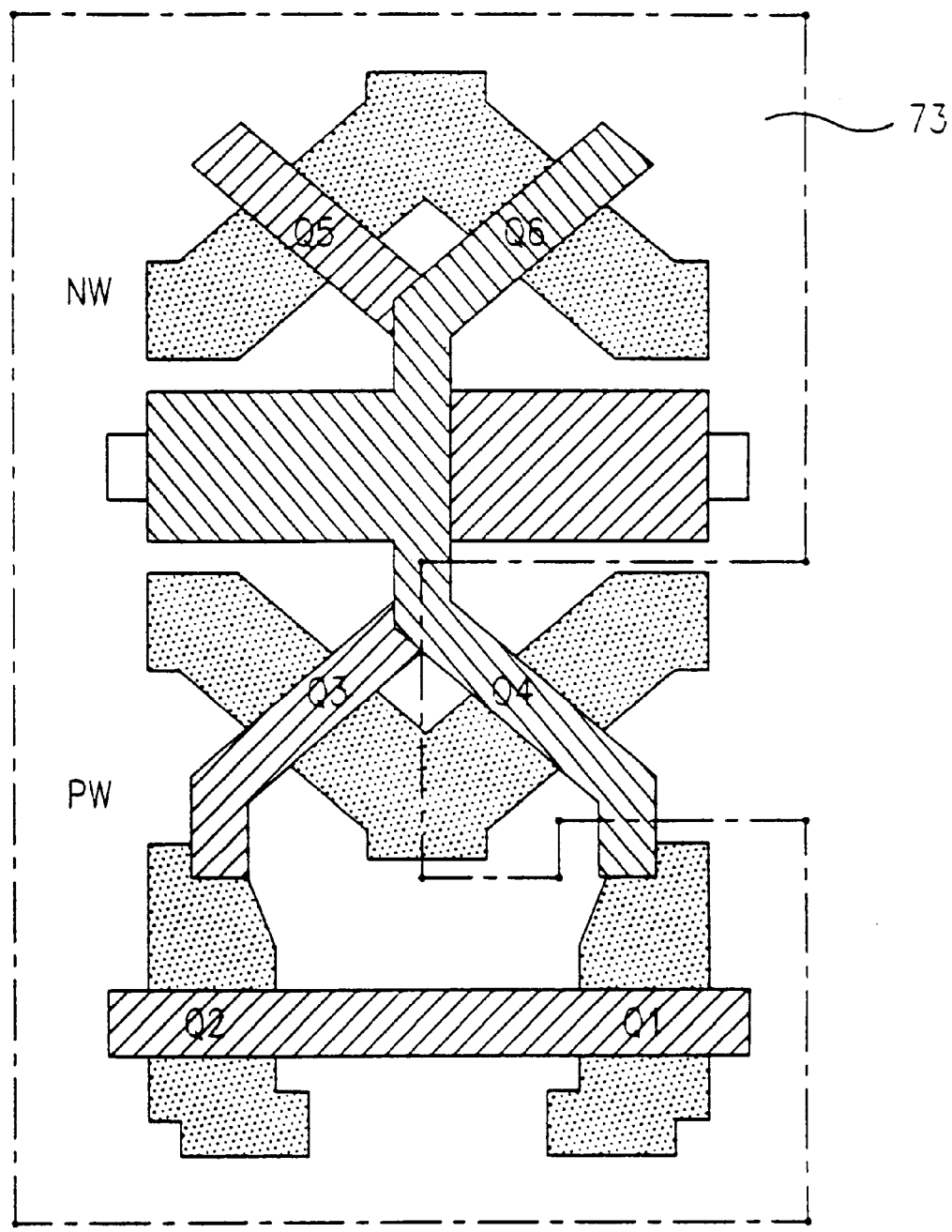
Figure 7D:
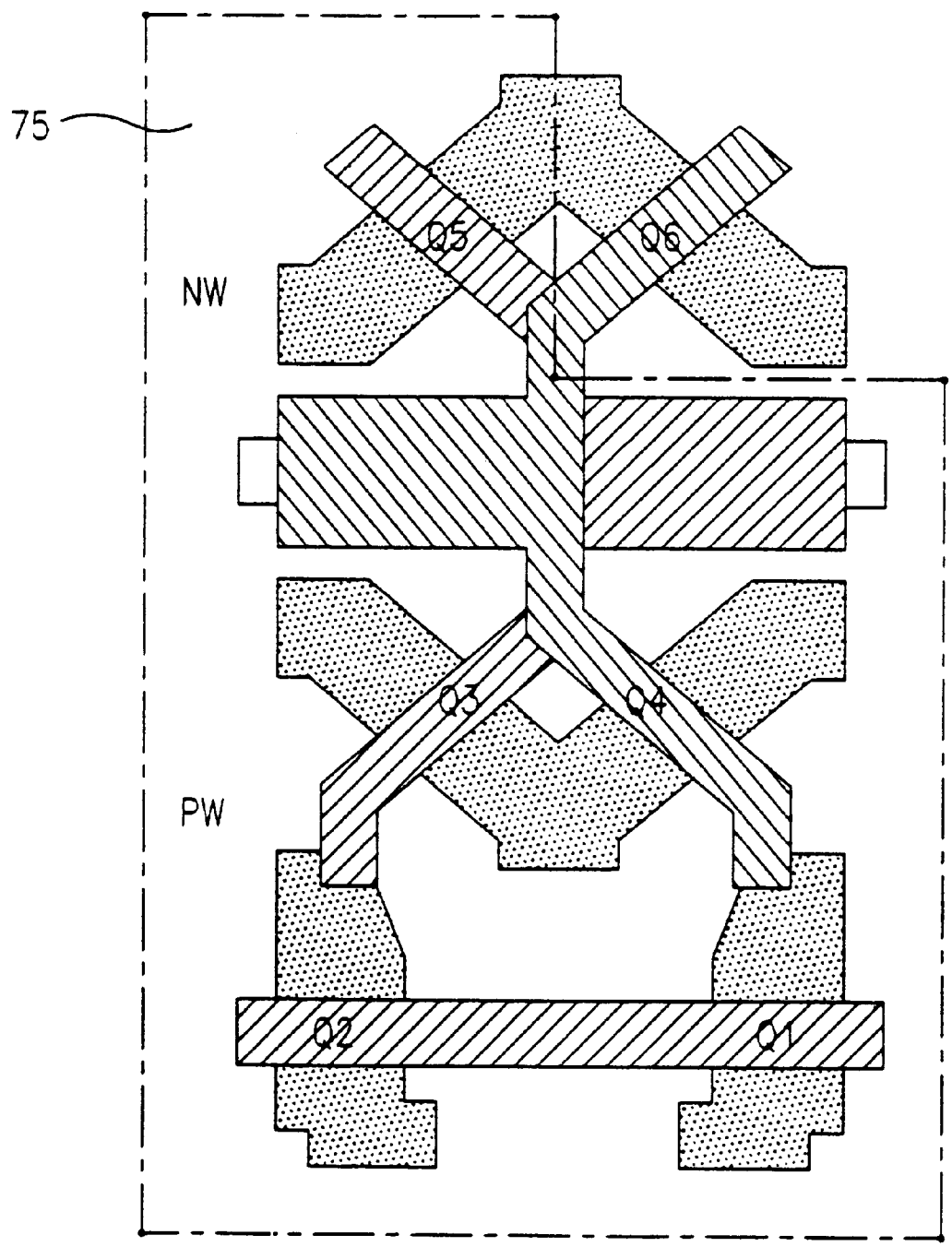

However, the photoresist film 73 is selectively removed, as shown in FIG. 7C, so that a portion of the p well region that was not exposed by the first ion-implanting process is now exposed.

An n type ion-implanting process is carried out over the selectively exposed p well region.

Referring to FIGS. 6M and 6M', the fourth photoresist film 73 is removed. A fifth photoresist film 75 is coated on the entire surface and patterned to expose the n well region that was not exposed with the first ion-implanting process. The fifth photoresist film 75 masks the entire surface of the semiconductor substrate 40 in FIG. 6M, which is the cross-sectional view taken along the line III—III of FIG. 5C. Only the n well region is exposed in FIG. 6M', which is the cross-sectional view taken along the line IV—IV of FIG. 5C.

Next, p-type impurity ions are implanted into the exposed n well region.

Referring to FIGS. 6N and 6N', a fifth insulating layer is formed on the entire surface of the semiconductor substrate 40 including the second cap insulating film 72 and is then etched-back to form second sidewall spacers 76 on both sides of the third gate electrode 33a.

Referring to FIGS. 6O and 6O', using the first, second, and third gate electrodes 31a, 32a, and 33a as masks, impurity ions for source/drain are implanted to form source/drain regions S/D.

Through a masking process to form NMOS transistors, n-type impurity ions are implanted into the p well region. Also, p-type impurity ions are implanted into the n well region to form PMOS transistors. A wiring fabrication process then follows.

FIG. 8 is an equivalent circuit diagram of the SRAM cell of the present invention, which includes a bit line B/L, a bit bar line B/L, a word line at a right angle to the bit line B/L and the bit bar line B/L. First and second transistors Q1 and Q2, are connected to the word line through their gates G1 and G2, and connected to the bit line B/L and the bit bar line B/L through their sources S1 and S2. Third and fourth transistors Q3 and Q4 have their sources S3 and S4 commonly connected to the Vss line and their drains D5 and D6 connected to the drains D1 and D2 of the first and second transistors Q1 and Q2, respectively. Fifth and sixth transistors Q5 and Q6 have their sources S5 and S6 commonly connected to the Vcc line and their drains D5 and D6 connected to the drains D3 and D4 of the third and fourth transistors Q3 and Q4, respectively, and their gates G5 and G6 connected to the gates G3 and G4 of the third and fourth transistors Q3 and Q4, respectively. A first metal layer 81 electrically connects a node A commonly connected to the drains D1, D3 and D5 of the first, third, and fifth transistors Q1, Q3, and Q5, and to the gates G4 and G6 of the fourth and sixth transistors Q4 and Q6. A second metal layer 82 electrically connects a node B commonly connected to the drains D2, D4 and D6 of the second, fourth, and sixth transistors Q2, Q4, and Q6, and to the gates G3 and G5 of the third and fifth transistors Q3 and Q5. The fifth and sixth transistors Q5 and Q6 are PMOS transistors and the first to fourth transistors Q1 to Q4 are NMOS transistors.

The Vss line and the first and second metal lines 81 and 82 are formed simultaneously of an identical metal.

The operation of the equivalent circuit will be discussed below.

If a data bit to be written is high, the first and second transistors Q1 and Q2, which are access transistors, are turned on. The potentials at the nodes A and B are high and low, respectively. Thus, the fourth and sixth transistor Q4 and Q6 are turned on and turned off, respectively, by the potential of the node A. At this time the potential of the node B remains low.

Thus, using the potential of the node B, the third transistor Q3 is turned off and the fifth transistor Q5 is turned on, so that the potential of the node A remains high. Therefore, the data bit remains high.

On the other hand, when reading data from the SRAM cell, the bit line B/L and the bit bar line B/L are equalized. The first and second transistors Q1 and Q2, which are access transistors, are turned on. Thus the potentials of the pre-charged bit line B/L and bit bar line B/L are sensed to be outputted.

The method for fabricating the SRAM cell will be described in detail. FIGS. 5A to 5C are layouts of process steps when wires are not yet formed. The process steps following the steps shown in FIGS. 5A to 5C will be described below with reference to FIGS. 9A to 9C.

Referring to FIG. 9A, an interlevel insulating layer (a sixth insulating layer) (not shown), is formed on the entire surface of the semiconductor substrate including the third gate line 33. Subsequently, the sixth insulating layer is selectively removed to simultaneously expose the first active region 42 of the n well region, the third and fourth active regions 44 and 45 of the p well region, and the second and third gate lines 32 and 33 on the third and fourth active regions 44 and 45, thereby forming first contact holes 91. A third polysilicon layer is formed on the entire surface of the semiconductor substrate including the first contact holes 91. A Vcc line 92 is formed in the same direction of the first gate line 31 and in electrical contact with the first active region 42. A conductive layer 92a is simultaneously patterned to electrically connect the third and fourth active regions 44 and 45 of the p well region to the second and third gate lines 32 and 33, respectively.

The conductive layer 92a and the Vcc line 92 are formed of the same polysilicon layer.

Referring to FIG. 9B, seventh and eighth insulating layers (not shown) are successively formed on the entire surface of the semiconductor substrate including the Vcc line 92. The eighth, seventh, and sixth insulating layers are selectively removed to expose the semiconductor substrate corresponding to the second active region of the p well region and the first active region 42 of the n well region and the second and third gate lines 32 and 33 over the well trench 41, thereby forming second contact holes 93.

A metal layer is deposited on the entire surface of the semiconductor substrate including the second contact holes 93 and patterned to form a Vss line 83 and first and second metal layers 81 and 82 connecting the first active region 42 to the second active region 43.

The second contact holes 93 on the first active region 42 connect the drain D5 of the fifth transistor Q5 to the drain D3 of the third transistor Q3, and the drain D6 of the sixth transistor Q6 to the drain D4 of the fourth transistor Q4. The first metal layer 81 is connected to the third gate line 33 over the well trench 41, and the second metal layer 82 is connected to the second gate electrode 32. The Vss line 83 is commonly connected to the sources S3 and S4 of the third and fourth transistors Q3 and Q4, respectively, through the second contact holes 93.

After forming the Vss line 83 and the first and second metal layers 81 and 82, a ninth insulating film (not shown) is formed on the entire surface.

Referring to FIG. 9C, a bit line 95 and a bit bar line 96 are formed at a right angle to the Vcc and Vss lines 92 and 93 to connect to the third and fourth active regions 44 and 45, respectively, through the third contact holes 94.

A method for fabricating the SRAM cell shown in FIGS. 9A–9C will be described with reference to FIGS. 10a to 10F and 10A' to 10F'.

Referring to FIGS. 10a and 10A', a sixth insulating layer 77 is formed on the entire surface of the semiconductor substrate 40 where the first and second gate electrodes 31a and 32a and the source/drain impurity regions S/D are formed. As shown in FIG. 10A, the sixth insulating layer 77 is selectively removed to form a first contact hole 91. As shown in FIG. 10A', the first contact hole 91 is formed to electrically connect the third active region 44 of the p well region to the second gate electrode 32a.

Figure 10B:
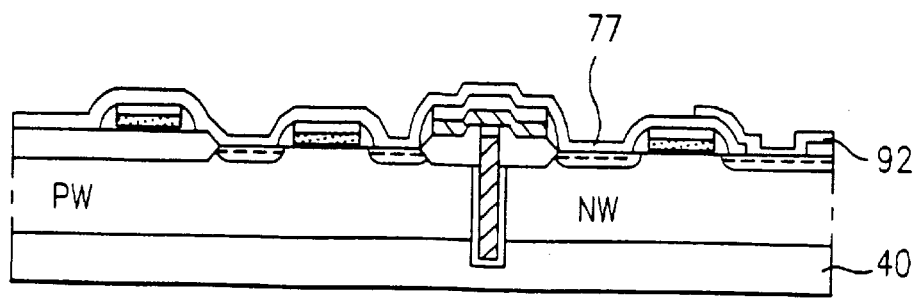
Figure 10B:
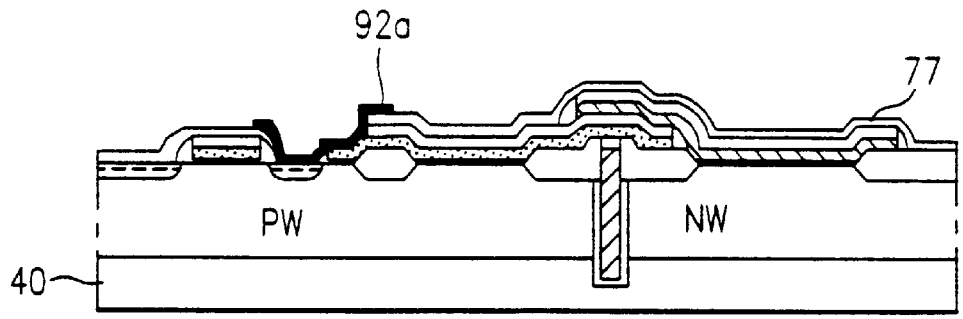

Referring to FIGS. 10B and 10B', a third polysilicon layer is formed on the entire surface of the semiconductor substrate 40 including the first contact holes 91. A photo etching process is carried out to selectively remove the third polysilicon layer, thereby forming a Vcc line 92. Simultaneously, a conductive layer 92a, formed of the same material as the third polysilicon layer, is also formed to electrically connect the third active region 44 of the p well region to the second gate electrode 32a.

Figure 10C:
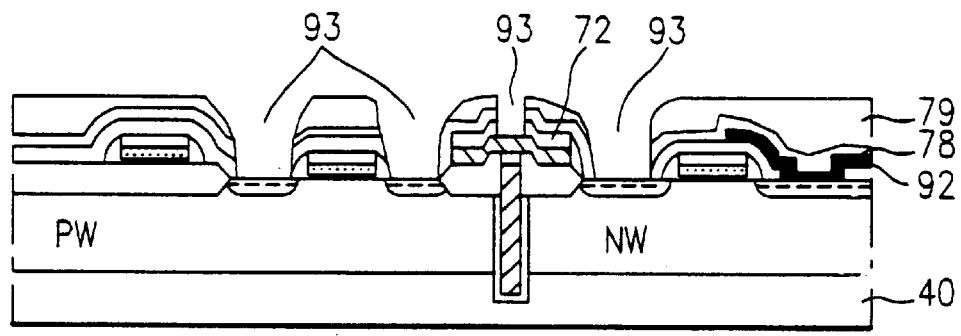
Figure 10C:
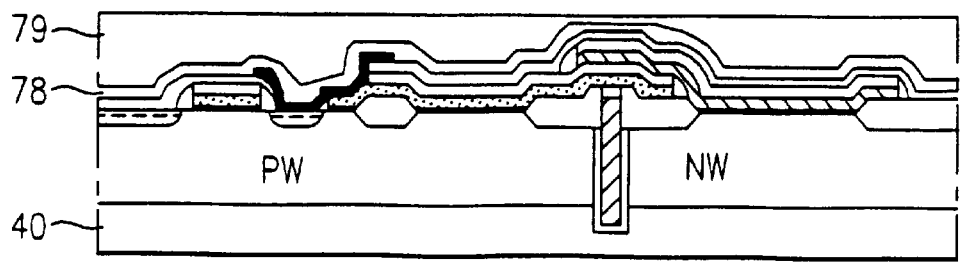

Referring to FIGS. 10C and 10C', a seventh insulating layer 78 is formed on the entire surface of the semiconductor substrate 40 including the Vcc line 92. An eighth insulating layer 79 is formed on the seventh insulating layer 78. As shown in FIG. 10C, a photo etching process is carried out to selectively remove the eighth and seventh insulating layers 79 and 78 and the second cap insulating film 72 to expose the second gate electrode 32a over the well trench 41 and the active region of the n and p well regions. As a result, second contact holes 93 are formed. At this time, no second contact holes 93 are shown in FIG. 10C' showing a cross-sectional view along the line IV—IV of FIG. 9B.

Figure 10D:
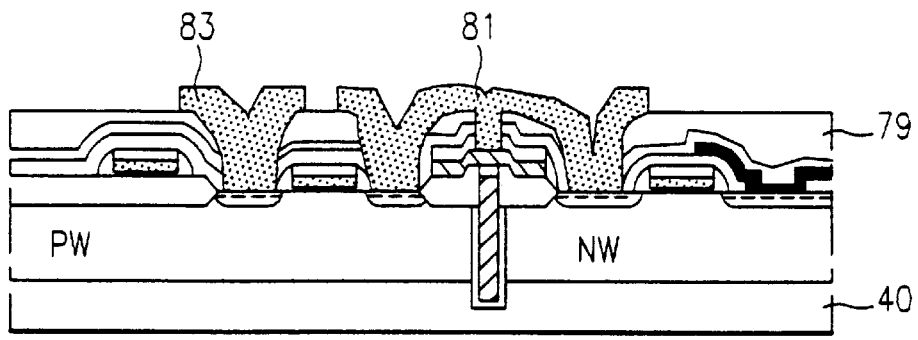
Figure 10D:
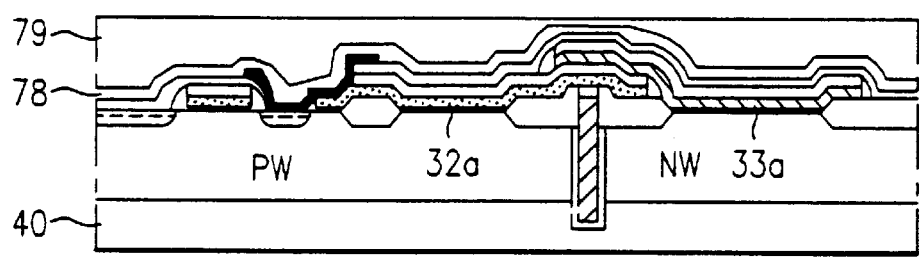

Referring to FIGS. 10D and 10D', a metal layer is deposited on the entire surface of the semiconductor substrate 40 including the second contact holes 93. As shown in FIG. 10D, a first metal layer 81 is formed to electrically connect the active region of the n well region, the active region of the p well region, and the third gate electrode 33a over the well trench 41. The Vss line 83 is formed in contact with the active region of the p well region. In FIG. 10D' showing the cross-sectional view taken along line IV—IV of FIG. 9D, the second metal layer 82 which electrically connects the active region of the n well region, the active region of the p well region, and the second gate electrode 32a over the well trench 41 is not shown.

Figure 10E:
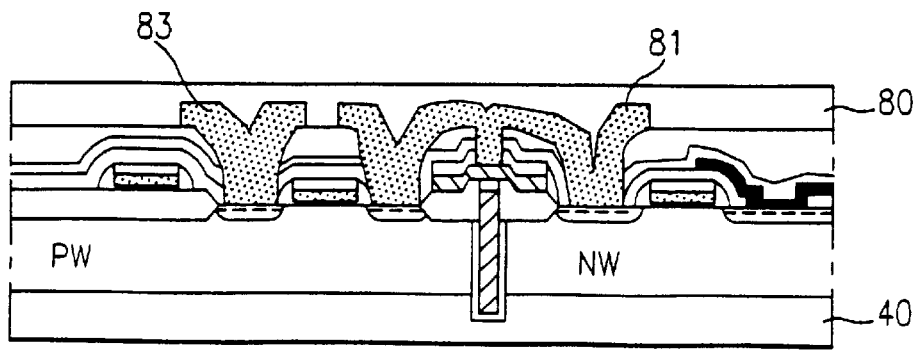
Figure 10E:
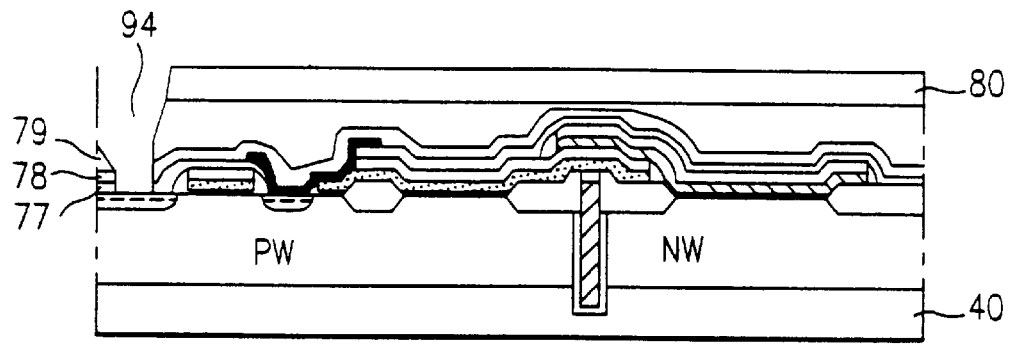

Referring to FIGS. 10E and 10E', a ninth insulating layer 80 is formed on the entire surface of the semiconductor substrate 40 including the first metal layer 81 and the second metal layer 82, (not shown in the FIGS. 10E and 10E'), and the Vss line 83. A photo etching process is carried out to selectively remove the ninth insulating layer 80, thereby forming the third contact holes 94 over the source regions S3 and S4 of the third and fourth NMOS transistors Q3 and Q4.

Figure 10F:
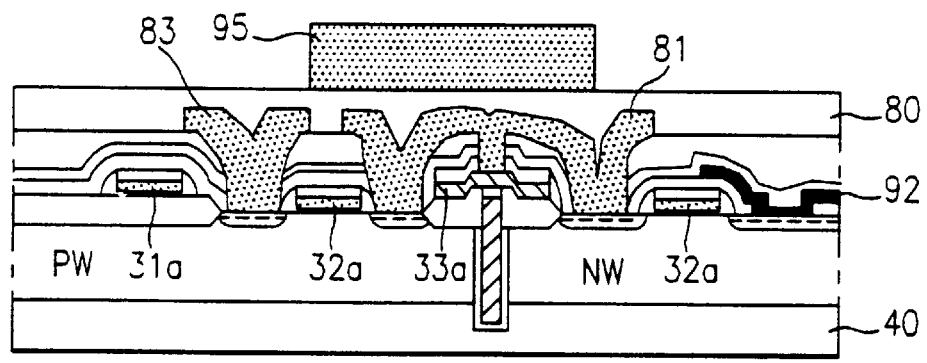
Figure 10F:
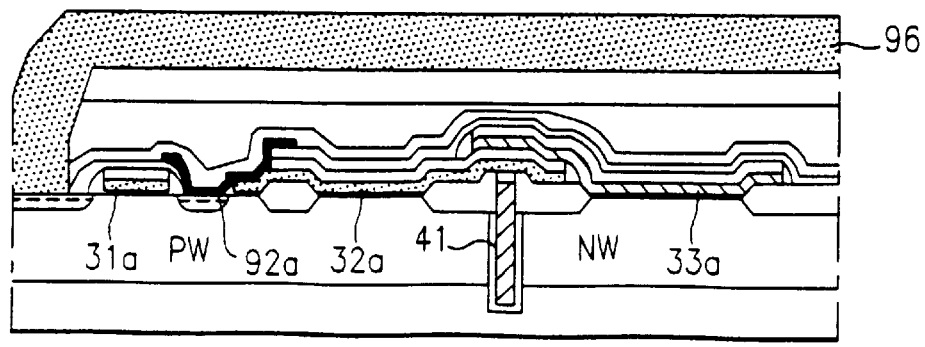

Referring finally to FIGS. 10F and 10F', a metal layer is formed on the entire surface including the third contact holes 94 and is patterned to form the bit line 95 and the bit bar line 96 connected to the source regions S3 and S4 of the third and fourth NMOS transistors Q3 and Q4, respectively.

The structure of the SRAM cell and the fabricating method of the present invention have the following advantages. Cells are constructed symmetrically, which is advantageous for low-voltage operation. Further, they are constructed in FULL CMOS, the power consumption is low, and the fabricating process is simplified. Furthermore, the area of the SRAM cell is minimized, and the packing density is increased. Finally, since a Vss line is commonly connected to the sources S3 and S4 of the third and fourth transistors Q3 and Q4, identical ground line resistances of these transistors can be obtained.

It will be apparent to those skilled in the art that various modification and variations can be made in the SRAM cell and the corresponding method of the present invention without departing from the spirit or scope of the inventions. Thus, it is intended that the present invention cover the modifications and variations of this invention provided they come within the scope of the appended claims and their equivalents.

What is claimed is:

1. A CMOS SRAM cell, comprising:
    a substrate divided by a well trench into an n well region and a p well region;
    first and second active regions each having a V shape, formed symmetrical relative to each other, and having the well trench in between;
    third and fourth active regions formed symmetrically relative to each other and offset from the second active region;
    first and second gate lines each crossing the first active region, the well trench, and the second active region; and
    a third gate line crossing the third and fourth active regions.

2. The CMOS SRAM cell of claim 1, wherein the first active region is formed in the n well and the second, third, and fourth active regions are formed in the p well.

3. The CMOS SRAM cell of claim 2, further including:
    first and second PMOS transistors formed in the first active region;
    first and second NMOS transistors formed in the second active region; and
    third and fourth NMOS transistors formed in the third and fourth active regions, respectively.

4. The CMOS SRAM cell of claim 3, wherein a center portion of the first active region is a common drain region of the first and second PMOS transistors.

5. The CMOS SRAM cell of claim 4, further including a first power supply line connected to the common drain region of the first and second PMOS transistors through a contact hole.

6. The CMOS SRAM cell of claim 3, wherein a center portion of the second active region is a common source region of the first and second NMOS transistors.

7. The CMOS SRAM cell of claim 6, further including a second power supply line connected to the common source region of the first and second NMOS transistors through a contact hole.

8. The CMOS SRAM cell of claim 3, wherein the first and second gate lines are connected to drain regions of the third and fourth NOMS transistors, respectively.

9. The CMOS SRAM cell of claim 8, wherein source regions of the third and fourth NMOS transistors are connected to a bit line and a bit bar line, respectively.

10. The CMOS SRAM cell of claim 1, wherein the first and second gate lines are symmetrical relative to each other.

11. The CMOS SRAM cell of claim 10, wherein the first and second gate lines have a bow shape.

12. The CMOS SRAM cell of claim 11, further including an insulating layer between the first and second gate lines, wherein the second gate line overlaps the first gate line over the well trench.

13. The CMOS SRAM cell of claim 1, wherein the well trench is a straight line.

14. The CMOS SRAM cell of claim 1, wherein an axis of symmetry of the first and second active regions is perpendicular to an axis of symmetry of the third and fourth active regions.

15. The CMOS SRAM cell of claim 1, wherein the first, second, and third gate lines are formed of polysilicon.

16. A method for fabricating a CMOS SRAM cell, comprising the steps of:
    forming a well trench in a semiconductor substrate;
    implanting impurity ions to form p and n well regions;
    selectively forming isolating films on the p and n well regions to define a first active region in the n well region and second, third, and fourth active regions in the p well region;
    forming a first gate electrode crossing the first active region, the well trench, and the second active region and forming a second gate electrode crossing the third and fourth active regions; and
    forming a third gate electrode crossing the first active region, the well trench, and the second active region.

17. The method of claim 16, wherein the step of selectively forming isolating films on the p and n well regions to define a first active region in the n well region and second, third, and fourth active regions in the p well region includes forming the first and second active regions symmetrically relative to each other, and forming the third and fourth active regions symmetrically relative to each other.

18. The method of claim 17, wherein the step of selectively forming isolating films on the p and n well regions to define a first active region in the n well region and second, third, and fourth active regions in the p well region includes forming the first, second, third and fourth active regions having axis of symmetry of the first and second active regions perpendicular to an axis of symmetry of the third and fourth active regions.

19. The method of claim 17, wherein the step of selectively forming isolating films on the p and n well regions to define a first active region in the n well region and second, third, and fourth active regions in the p well region includes forming the first and second active regions having a V shape.

20. The method of claim 16, wherein the step of forming a first gate electrode crossing the first active region, the well trench, and the second active region and forming a second gate electrode crossing the third and fourth active regions includes forming the first and second gate electrodes having a bow shape.

21. The method of claim 20, wherein the step of forming a first gate electrode crossing the first active region, the well trench, and the second active region and a second gate electrode crossing the third and fourth active regions includes the step of forming an insulating layer between the first gate electrode and the second gate electrode, wherein the first and second gate electrodes overlap each other over the well trench.

22. The method of claim 16, wherein the step of forming a well trench in a semiconductor substrate and the step of implanting impurity ions to form p and n well regions include forming the well trench having a depth greater than a depth of the p and n well regions.

23. The method of claim 16, further including the step of forming a first contact hole at a center portion of the first active region for connecting the first active region to a first power supply voltage line.

24. The method of claim 16, further including the step of forming a second contact hole at a center portion of the second active region for connecting the second active region to a second power supply voltage line.

25. The method of claim 16, further including the step of forming a bit line and a bit bar line, wherein sides of the third and fourth active regions are connected to the bit line and the bit bar line, respectively.

26. A CMOS SRAM cell, comprising:
a first active region formed in a semiconductor substrate and having a V shape;
a second active region formed in the semiconductor substrate, wherein the second active region is substantially a mirror image of the first active about a first axis of symmetry;
a third active region formed in the semiconductor substrate and offset from the first and second active regions;
a fourth active formed in the semiconductor substrate, wherein the fourth active region is substantially a mirror image of the third active region about a second axis of symmetry;
a first gate line crossing the third and fourth active regions;
a second gate line crossing the first active region and the second active region and having a bow shape;
a third gate line crossing the first active region and the second active region, wherein the first gate line is substantially a mirror image of the second gate about the first axis of symmetry;
a Vcc line substantially parallel to the first electrode and connected to the first active region;
a Vss line substantially parallel to the first electrode and connected to the second active region;
a bit line connected to the third active region; and
a bit bar line connected to the fourth active region.

27. The CMOS SRAM cell of claim 26, further including a well trench between the first active region and the second active region.

28. The CMOS SRAM cell of claim 27, wherein the second gate electrode overlaps the third gate electrode over the well trench.

29. The CMOS SRAM cell of claim 26, further including a first metal layer connecting a first portion of the first active region to the third gate line and to a first portion of the second active region.

30. The CMOS SRAM cell of claim 29, wherein the first portion of the first active region is located at a first end of the V shape of the first active region, and the first portion of the second active region is located at a first end of the V shape of the second active region.

31. The CMOS SRAM cell of claim 26, further including a second metal layer connecting a second portion of the first active region to the second gate line and to a second portion of the second active region.

32. The CMOS SRAM cell of claim 31, wherein the second portion of the first active region is located at a second end of the V shape of the first active region, and the second portion of the second active region is located at a second end of the V shape of the second active region.

33. The CMOS SRAM cell of claim 26, wherein the first active region is formed in a p well region of the substrate, and the second, third and fourth active regions are formed in an n well region of the substrate.

34. The CMOS SRAM cell of claim 33, wherein a depth of the well trench is greater than a depth of the p well region or a depth of the n well region.

35. The CMOS SRAM cell of claim 26, wherein the first gate line is connected to a word line.

36. The CMOS SRAM cell of claim 26, wherein the Vcc line is connected to the first active region at a center portion of the first active region.

37. The CMOS SRAM cell of claim 26, wherein the Vss line is connected to the second active region at a center portion of the second active region.

38. The CMOS SRAM cell of claim 26, wherein the first axis of symmetry is substantially perpendicular to the second axis of symmetry.

39. A method of manufacturing a CMOS SRAM cell, comprising the steps of:
forming a well trench in a substrate;
forming first, second, third and fourth active regions in the substrate, wherein the first active region has a V shape, wherein the second active region is a mirror image of the first active region about a first axis of symmetry, wherein the third and fourth active regions are offset from the first and second active regions, and wherein the third active region is a mirror image of the fourth active region about a second axis of symmetry;
forming a first gate line crossing the third and fourth active regions and forming a second gate line crossing the first active region, the well trench, and the second active region;
forming a third gate line crossing the first active region, the well trench, and the second active region, wherein the second gate line overlaps the third gate line over the well trench;
forming a Vcc line substantially parallel to the first gate line and in contact with the first active region;
connecting the second gate line to the third active region;
connecting the third gate line to the fourth active region;
forming a Vss line substantially parallel to the first gate line and connected to the second active region;
connecting the third gate line to a first portion of the first active region and a first portion of the second active region, and connecting the second gate line to a second portion of the first active region and a second portion of the second active region; and
forming a bit line connected to the third active region, and a bit bar line connected to the fourth active region.

40. The method of claim 39, wherein the step of forming first, second, third and fourth active regions in the substrate includes the step of forming the first active region in an n well region, and forming the second, third and fourth active regions in a p well region.

41. The method of claim 39, wherein the step of forming a first gate line, the step of forming a second gate line and the step of forming a third gate line includes the step of forming insulating spacers on sides of the first, second and third gate electrodes.

42. The method of claim 39, wherein the step of forming a well trench in a substrate includes the step of filling the well trench with an insulating material.

43. The method of claim 39, further including the step of connecting the first gate line to a word line.

44. The method of claim 39, wherein the step of connecting the third gate line to a first portion of the first active region and a first portion of the second active region, and connecting the second gate line to a second portion of the first active region and a second portion of the second active region includes the steps of:

forming first contact holes over the third and fourth active regions; and forming conductive layers connecting the second gate electrode to the third active region, and the third gate electrode to the fourth active region.

45. The method of claim 39, wherein the step of connecting the third gate line to a first portion of the first active region and a first portion of the second active region, and connecting the second gate line to a second portion of the first active region and a second portion of the second active region includes the steps of:

forming second contact holes exposing a portion of the third gate electrode, the first and second portions of the first active region, and the first and second portions of the second active region;

forming a first metal layer connecting the third gate line to a first portion of the first active region and a first portion of the second active region; and forming a second metal layer connecting the second gate line to a second portion of the first active region and a second portion of the second active region.

46. The method of claim 39, wherein the step of forming a Vcc line substantially parallel to the first gate line and in contact with the first active region includes the step of forming a hole exposing a center portion of the first active region prior to forming the Vcc line.

47. The method of claim 39, wherein the step of forming a Vss line substantially parallel to the first gate line and connected to the second active region includes the step of forming a hole exposing a center portion of the first active region prior to forming the Vss line.

48. The method of claim 39, wherein the step of forming a first gate line crossing the third and fourth active regions and forming a second gate line crossing the first active region, the well trench, and the second active region and the step of forming a third gate line crossing the first active region, the well trench, and the second active region includes the step of forming an insulating layer between the second gate electrode and the second gate electrode.

* * * * *